United States Patent
Begley et al.

(10) Patent No.: US 7,368,180 B2
(45) Date of Patent: May 6, 2008

(54) ELECTROLUMINESCENT DEVICE CONTAINING BORONDIKETONATE EMITTER

(75) Inventors: William J. Begley, Webster, NY (US); Tukaram K. Hatwar, Penfield, NY (US); Natasha Andrievsky, Webster, NY (US); Manju Rajeswaran, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 289 days.

(21) Appl. No.: 11/170,699

(22) Filed: Jun. 29, 2005

(65) Prior Publication Data
US 2007/0003784 A1    Jan. 4, 2007

(51) Int. Cl.
 H01L 51/50 (2006.01)
(52) U.S. Cl. ............ 428/690; 428/917; 313/504; 313/506
(58) Field of Classification Search ........ 428/690, 428/917; 313/504, 506, 112; 257/102, 103, 257/98, E51.049
See application file for complete search history.

(56) References Cited

U.S. PATENT DOCUMENTS

| 7,026,490 B2* | 4/2006 | Hartmann et al. ............ 549/4 |
| 2004/0124766 A1* | 7/2004 | Nakagawa et al. ......... 313/504 |
| 2004/0247937 A1* | 12/2004 | Chen et al. ................. 428/690 |

FOREIGN PATENT DOCUMENTS

| JP | 2000030869 | 1/2000 |
| JP | 2000159777 | 6/2000 |
| WO | WO 0221611 | * 3/2002 |

\* cited by examiner

*Primary Examiner*—Dawn Garrett
(74) *Attorney, Agent, or Firm*—Arthur E. Kluegel

(57) ABSTRACT

An OLED device comprises a light-emitting layer containing a hydrocarbon host material and a light-emitting material of Formula (1):

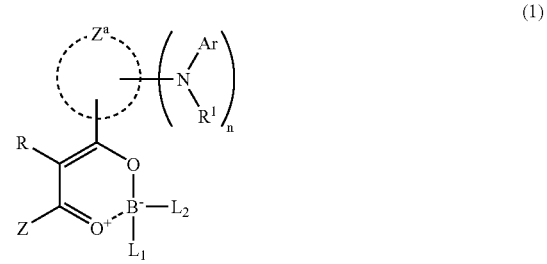

(1)

wherein:
 each Ar represents an independently selected aromatic group;
 each $R^1$ represents an independently selected alkyl group or aromatic group;
 n is 1 or 2;
 $Z^a$ represents the atoms necessary to form an aromatic ring group;
 R represents hydrogen or a substituent group;
 Z represents hydrogen or a substituent group; and
 $L^1$ and $L^2$ represent independently selected substituent groups;
provided that any two adjacent substituents of any of the above groups may join to form a ring.

20 Claims, 1 Drawing Sheet

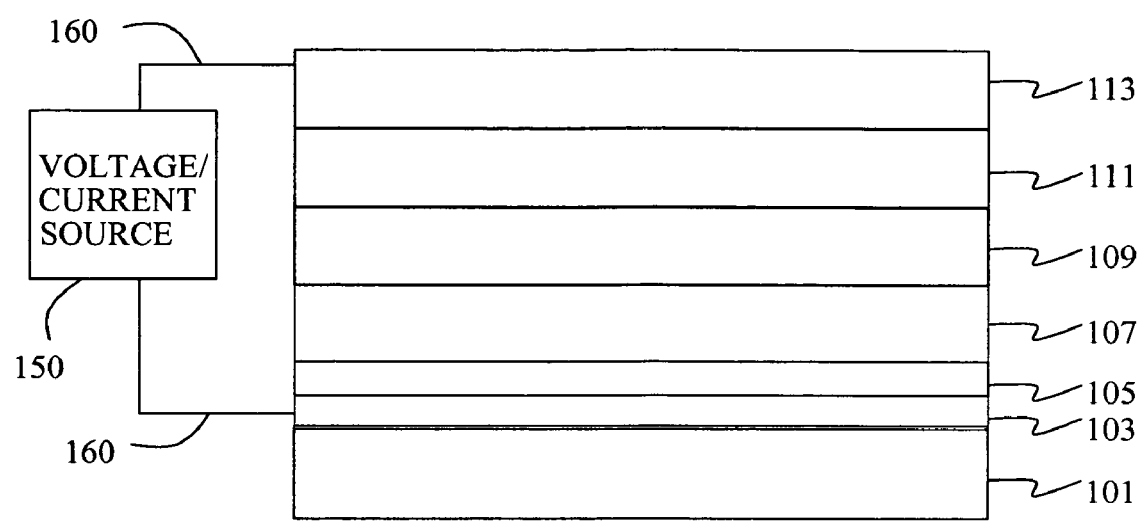

ELECTROLUMINESCENT DEVICE
CONTAINING BORONDIKETONATE
EMITTER

FIELD OF THE INVENTION

This invention relates to an electroluminescent (EL) device comprising a light-emitting layer comprising a boron complex and a hydrocarbon host that can provide improved luminance.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often greater than 100V.

More recent organic EL devices include an organic EL element consisting of extremely thin layers (e.g. <1.0 µm) between the anode and the cathode. Herein, the term "organic EL element" encompasses the layers between the anode and cathode. Reducing the thickness lowered the resistance of the organic layers and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by C. Tang et al. (*J. Applied Physics*, Vol. 65, 3610 (1989)). The light-emitting layer commonly consists of a host material doped with a guest material, otherwise known as a dopant. Still further, there has been proposed in U.S. Pat. No. 4,769,292 a four-layer EL element comprising a hole injecting layer (HIL), a hole-transporting layer (HTL), a light-emitting layer (LEL) and an electron-transporting/injecting layer (ETL). These structures have resulted in improved device efficiency.

Since these early inventions, further improvements in device materials have resulted in improved performance in attributes such as color, stability, luminance efficiency and manufacturability, e.g., as disclosed in U.S. Pat. No. 5,061,569, U.S. Pat. No. 5,409,783, U.S. Pat. No. 5,554,450, U.S. Pat. No. 5,593,788, U.S. Pat. No. 5,683,823, U.S. Pat. No. 5,908,581, U.S. Pat. No. 5,928,802, U.S. Pat. No. 6,020,078, and U.S. Pat. No. 6,208,077, amongst others.

Notwithstanding these developments, there are continuing needs for organic EL device components, such as light-emitting materials, sometimes referred to as dopants, that will provide high luminance efficiencies combined with high color purity and long lifetimes. In particular, there is a need to be able to adjust the emission wavelength of the light-emitting material for various applications. For example, in addition to the need for blue, green, and red light-emitting materials there is a need for blue-green, yellow and orange light-emitting materials in order to formulate white-light emitting electroluminescent devices. For example, a device can emit white light by emitting a combination of colors, such as blue-green light and red light or a combination of blue light and yellow light.

The preferred spectrum and precise color of a white EL device will depend on the application for which it is intended. For example, if a particular application requires light that is to be perceived as white without subsequent processing that alters the color perceived by a viewer, it is desirable that the light emitted by the EL device have 1931 Commission International d'Eclairage (CIE) chromaticity coordinates, (CIEx, CIEy), of about (0.33, 0.33). For other applications, particularly applications in which the light emitted by the EL device is subjected to further processing that alters its perceived color, it can be satisfactory or even desirable for the light that is emitted by the EL device to be off-white, for example bluish white, greenish white, yellowish white, or reddish white.

White EL devices can be used with color filters in full-color display devices. They can also be used with color filters in other multicolor or functional-color display devices. White EL devices for use in such display devices are easy to manufacture, and they produce reliable white light in each pixel of the displays. Although the OLEDs are referred to as white, they can appear white or off-white, for this application, the CIE coordinates of the light emitted by the OLED are less important than the requirement that the spectral components passed by each of the color filters be present with sufficient intensity in that light. Thus there is a need for new materials that provide high luminance intensity for use in white OLED devices. The devices must also have good stability in long-term operation. That is, as the devices are operated for extended periods of time, the luminance of the devices should decrease as little as possible.

Rigidized boron complexes have been used as labeling dyes in analytical and biological applications; for example, see U.S. Pat. No. 4,774,339, EP 747,448 and EP 46, 861. However, boron complexes have found only limited application as dopants in electroluminescent devices. In one example, a useful class of dopants is derived from the 5,6,5-tricyclic pyrromethene-$BF_2$ complexes and disclosed in U.S. Pat. No. 5,683,823; JP 09 289,081A; and JP 11 097,180A. These materials are characterized by typically narrow emission spectra, which may result in attractively high color purity. However, the green emitting unsubstituted or alkyl substituted pyrromethene-$BF_2$ complexes exhibit relatively low quantum efficiencies of electroluminescence. In order to achieve highly efficient OLEDs, one needs to use phenyl rings as substituents thereby extending the conjugated π-system. As a result, the emission wavelength typically becomes red-shifted yielding a reddish amber color, which is the shortest wavelength light that can be emitted by pyrromethene-$BF_2$ complexes with good efficiency. In simple terms, luminance efficient green or blue-green OLEDs do not appear to be conveniently obtained with pyrromethene $BF_2$ complexes used as dopants.

JP 2001294851A describes boron complexes of heterocycles used in an electroluminescent device. For example, it describes materials in which one ring includes a cyclic amide or sulfonamide. However, these materials are reported to afford a narrow emission spectrum, which would not necessarily be desirable for use in a white-light-emitting device, which must emit a broad spectrum of light. Also, in some cases these materials were not very efficient at emitting light.

US 2003/0198829A1 and US 2003/0201415A describe electroluminescent (EL) device containing a boron dopant compound containing a bis(azinyl)methene boron complex. Such compounds, however, can be inefficient in their quantum efficiency of emission. The use of these materials is also limited by the difficulty in tuning the emission wavelengths, for example, to obtain a blue-green emission.

Bis(phenyloxy)pyridine borohalide complexes have been described by J. Feng, Y Liu, F Li; Y. Wang, S. Liu, *Syn. Met.*, 137, 1101, (2003), J. Feng, Y Liu, F Li; Y. Wang, S. Liu, *Optical and Quantum Electronics*, 35, 259 (2003), P. Chou, C. Pi-Tai; C. Cheng, C. Chiou, G. Wu, *Angew. Chem., Int. Ed.*, 41, 2274, (2002), J. Feng, Y. Liu, Y. Wang, S. Liu, *Chinese Journal of Luminescence*, 23, 25 (2002), Y. Liu, J. Guo, H. Zhang, Huidong; Y. Wang, *Angew. Chem., Int. Ed.*, 41, 182, (2002), Y. Li, Y Liu, W. Bu, J. Guo and Y. Wang, *Chem. Comm. (Cambridge)*, 16, 1551, (2000), and Y. Wang, Y. Wu, L. Yanqin, L.Yu; Lu, J. Shen, Chinese Patent publication CN 1245822A. K. Ueno, K. Suzuki, A. Senoo, H. Tanabe, S. Yogi, EP 1,138,683A2, describe bis(aryloxy) pyridine boroaryl complexes.

Borondiketonates are an interesting class of materials that have been described in JP 2000/030869 as useful in the electron-transporting layer of an OLED device. They have also been reported as light-emitting materials in JP 2000/159777 where they are referred to as dioxoborane compounds. The materials are shown as the sole emitting layer component or as a dopant in an AlQ host. However, these materials, when used with a host other than a hydrocarbon, such as tris(8-quinolinolato)aluminum (III) (Alq) or 4,4'-Bis [N-(1-naphthyl)-N-phenylamino]biphenyl (NPB), tend to give unsatisfactory luminance and/or color.

Thus there remains a need for organic EL device components that will provide good color and high luminance.

SUMMARY OF THE INVENTION

The invention provides an OLED device comprising a light-emitting layer containing a hydrocarbon host material and a light-emitting material of Formula (1):

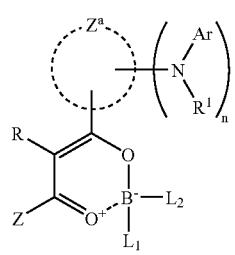

(1)

wherein:
each Ar represents an independently selected aromatic group;
each $R^1$ represents an independently selected alkyl group or aromatic group;
n is 1 or 2;
$Z^a$ represents the atoms necessary to form an aromatic ring group;
R represents hydrogen or a substituent group;
Z represents hydrogen or a substituent group; and
$L^1$ and $L^2$ represent independently selected substituent groups' provided that two adjacent substituents of any of the above groups may join to form a ring.

Devices of the invention provide good color and high luminance.

BRIEF DESCRIPTION OF THE DRAWINGS

The FIGURE shows a schematic cross-sectional view of one embodiment of the present invention including a light-emitting layer.

DETAILED DESCRIPTION OF THE INVENTION

As previously described, the OLED device of the invention includes a light-emitting layer comprising a hydrocarbon host material and a light-emitting material of Formula (1).

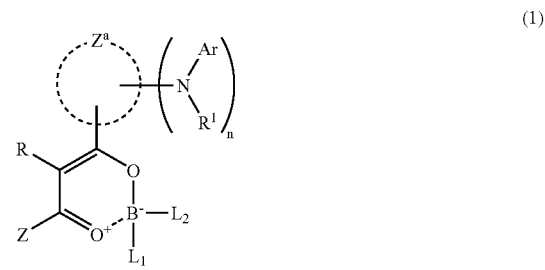

(1)

In Formula (1), each Ar independently represents an aromatic group, such as a phenyl group, a tolyl group, a pyridyl group or a naphthyl group. In one suitable embodiment Ar represents an aryl group.

Each $R^1$ represents an aromatic group, such as a phenyl group, a tolyl group or a naphthyl group; or an alkyl group, such as a methyl group or an ethyl group. In one desirable embodiment, $R^1$ represents an aromatic group, such as an aryl group. $R^1$ and Ar may also join together to form an additional ring, for example a carbazole ring group R represents hydrogen or a substituent group, such as a phenyl group or a cyano. In one suitable embodiment R represents hydrogen.

In Formula (1), n is 1 or 2. In one aspect of the invention, n is 1.

$Z^a$ represents the atoms necessary to form an aromatic ring group, such as a benzene ring group, a naphthalene ring group, a pyridine ring group or a thiazole ring group. In desirable aspect of the invention, $Z^a$ represents the atoms necessary to form a benzene ring group. $Z^a$ and R, as well as $Z^a$ and $R^1$, may also join together to form an additional ring group.

Z represents hydrogen or a substituent group, for example a trifluoromethyl group, a methyl group, a naphthyl group or a phenyl group. Desirably, Z represents an aromatic group such as a phenyl group, a tolyl group, or a pyridyl group.

$L^1$ and $L^2$ represent independently selected substituents. For illustrative examples, $L^1$ and $L^2$ can each independently represent a halogen substituent, an alkyl group, an aryl group, an alkoxy group, an alkylthio group, an arylthio group, a sulfamoyl group, an acetamido group, a diarylamino group, and an aryloxy group. In one desirable embodiment $L^1$ and $L^2$ represent independently a fluoro substituent or an alkyl carboxylate group, such as an acetate group or propionate group. In one desirable embodiment $L^1$ and $L^2$ both represent a fluoro substituent.

In formula (1) and the succeeding formulas, any two adjacent substituents of any of the above groups may join to form a ring.

In a further aspect of the invention the light-emitting material is represented by Formula (2).

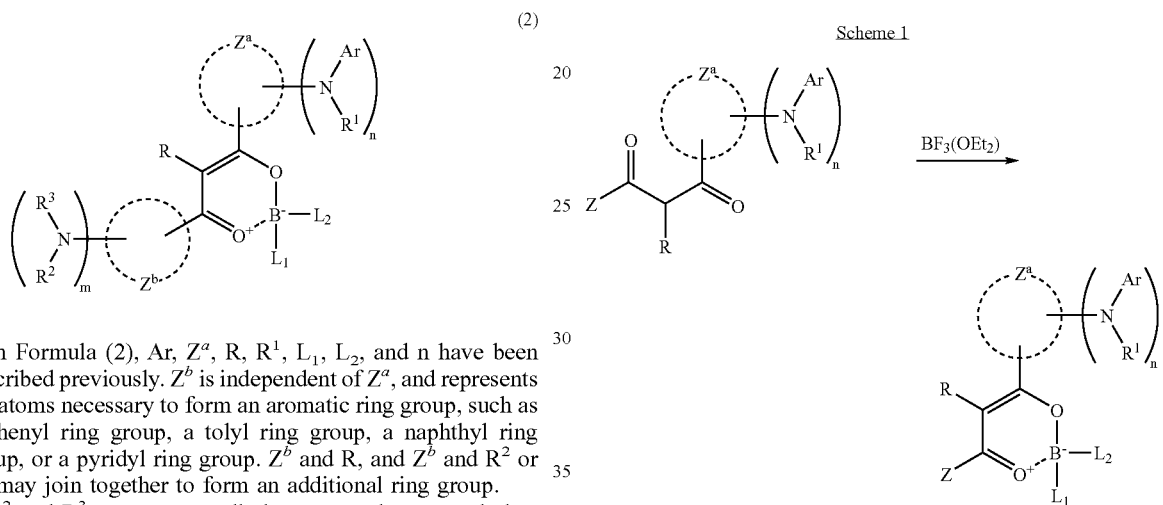

(2)

In Formula (2), Ar, $Z^a$, R, $R^1$, $L_1$, $L_2$, and n have been described previously. $Z^b$ is independent of $Z^a$, and represents the atoms necessary to form an aromatic ring group, such as a phenyl ring group, a tolyl ring group, a naphthyl ring group, or a pyridyl ring group. $Z^b$ and R, and $Z^b$ and $R^2$ or $R^3$ may join together to form an additional ring group.

$R^2$ and $R^3$ represent an alkyl group, such as a methyl or ethyl group or an aromatic group, such as a phenyl group or a tolyl group. $R^2$ and $R^3$ may also join together to form an additional ring, for example a carbazole ring group.

In Formula (2), m is 0, 1, or 2. In one suitable embodiment, m is 0 or 1.

In one desirable embodiment, $R^1$, $R^2$, and $R^3$ represent independently selected aromatic groups, such as aryl groups. In another suitable embodiment, R represents hydrogen. In a further embodiment, n is 1 and m is 0 or 1. In another desirable embodiment $Z^a$ and $Z^b$ represent the atoms necessary to form independently selected benzene ring groups.

In a still further aspect of the invention the light-emitting material is represented by Formula (3).

(3)

In Formula (3), R, $L^1$ and $L^2$ were described previously. Each $Ar^1$ and each $Ar^2$ represents an independently selected aromatic group, such as a phenyl group, a tolyl group, a pyridyl group or a naphthyl group. In one suitable embodiment each $Ar^1$ and each $Ar^2$ represents an independently selected aryl group. Each r represents a substituent group, such as a methyl group, a cyano, or a trifluoromethyl. In Formula (3), s is 0-4 and t is 0-5. In one desirable embodiment s and t are 0.

Desirably, the light-emitting material of Formula (1) is present in the light-emitting layer at a level of 0.1% to 15%, often at a level of 0.2% to 10%, frequently at a level of 0.25% to 8%, or suitably at a level of 0.5 to 5% by volume.

Materials of Formula (1) can be prepared by synthesizing the appropriate diketone compound and forming the boron complex by reacting this material with boron trifluoride etherate (Scheme 1). For example see JP 2000/159777.

Scheme 1

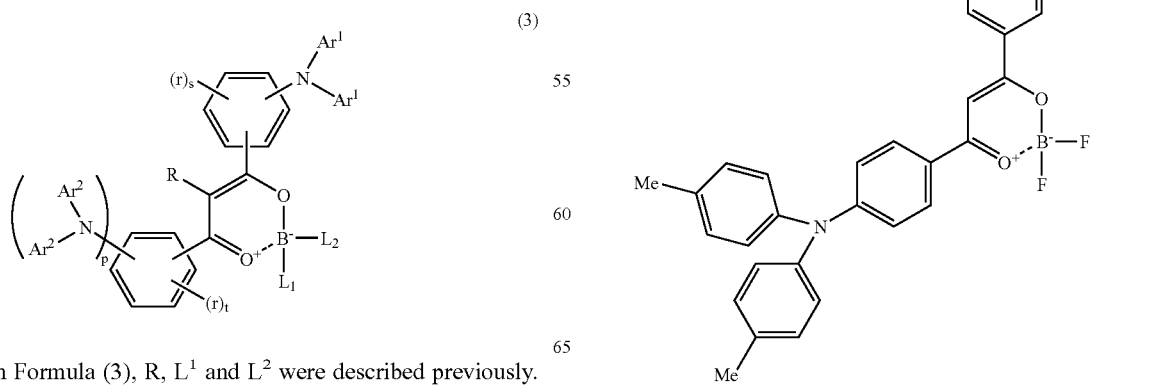

Illustrative examples of boron complexes of Formula (1) are given below.

Inv-1

-continued

Inv-2

Inv-3

Inv-4

Inv-5

Inv-6

Inv-7

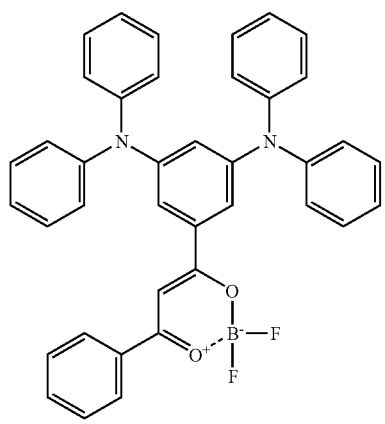
Inv-8
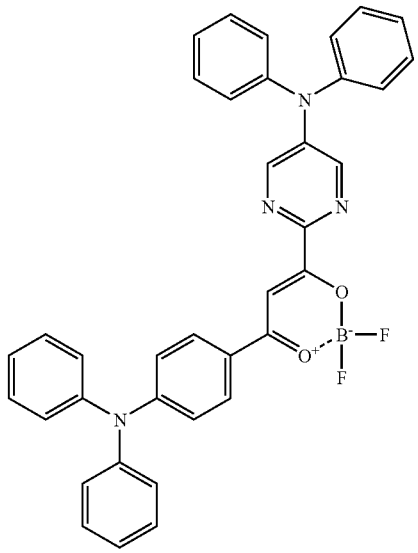
Inv-11
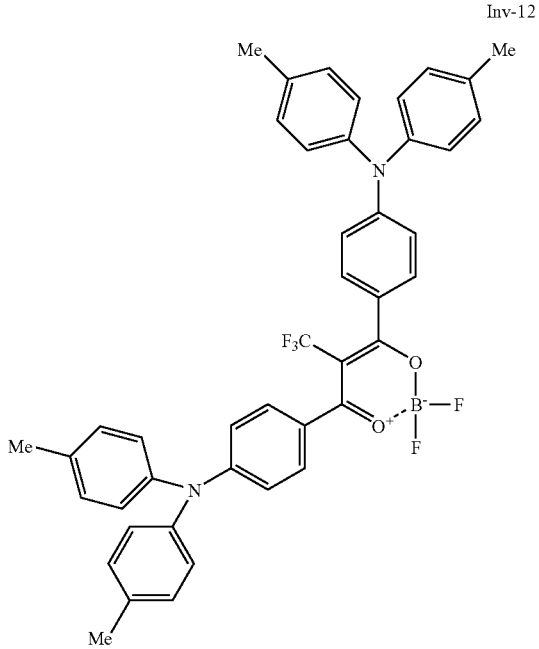
Inv-9
Inv-12
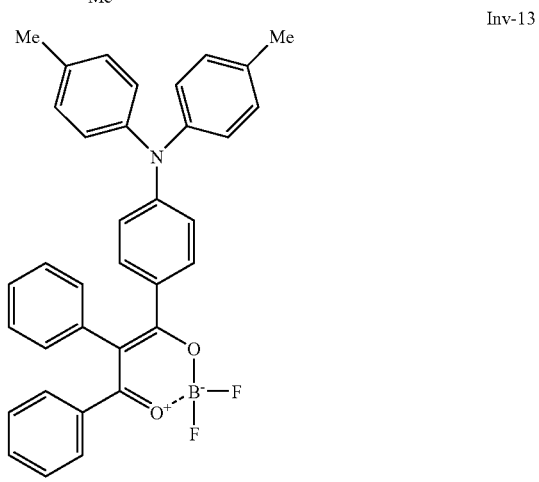
Inv-10
Inv-13

-continued
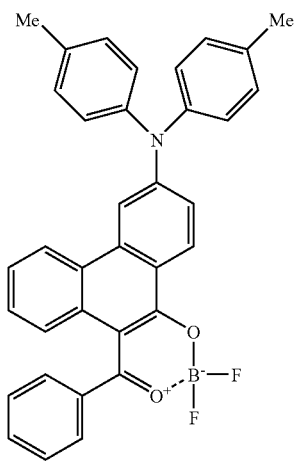
Inv-14
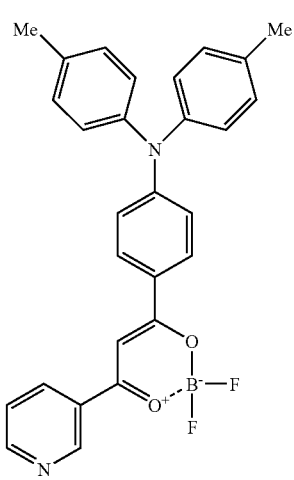
Inv-18
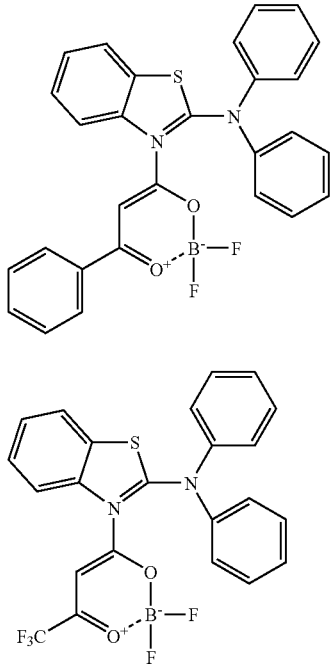
Inv-15
Inv-16
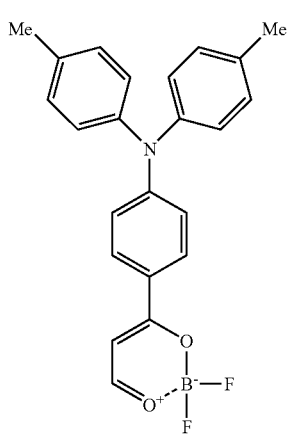
Inv-17
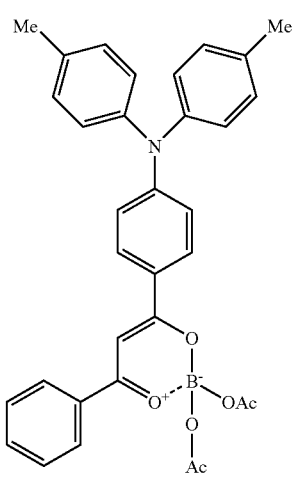
Inv-19
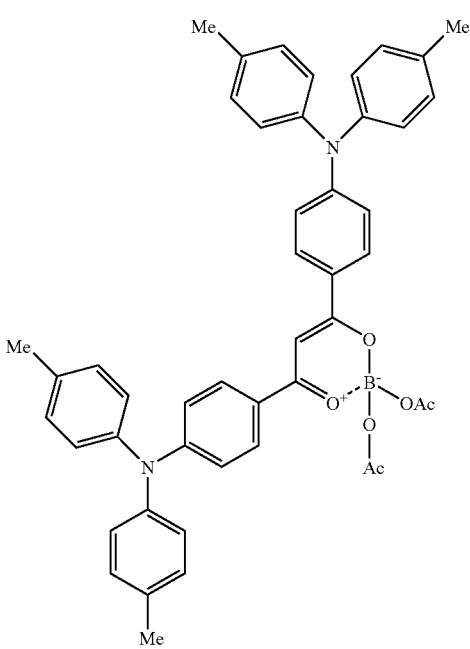
Inv-20

-continued
Inv-21
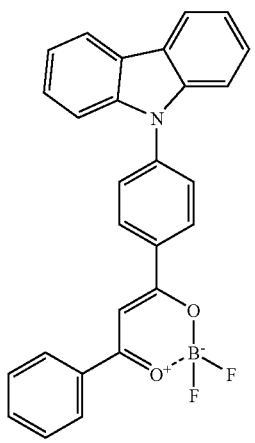
Inv-22
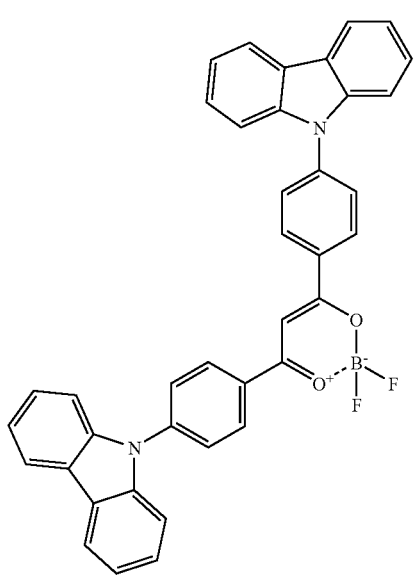
Inv-23
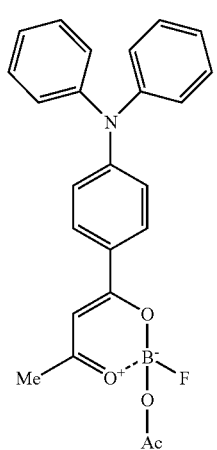
-continued
Inv-24
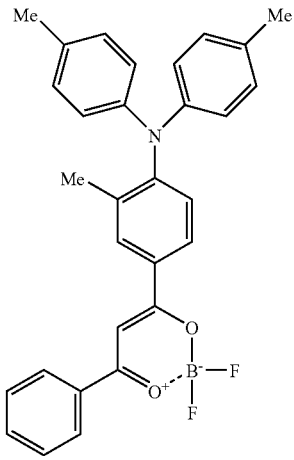
Inv-25
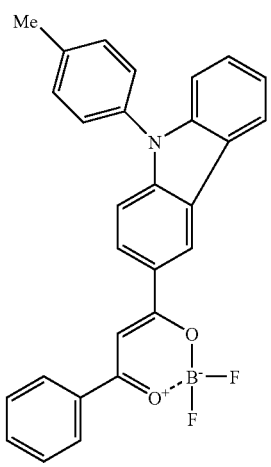
Inv-26
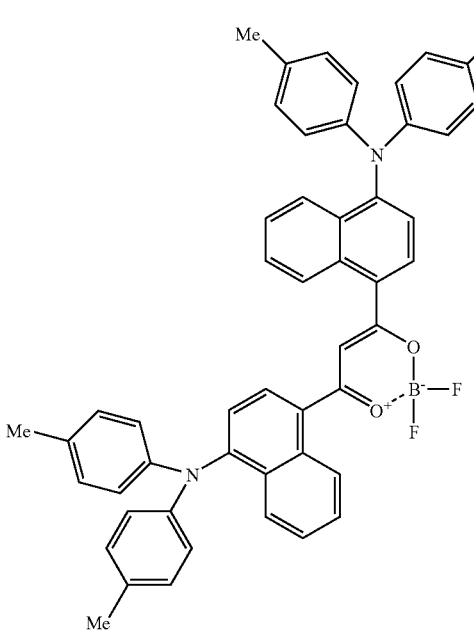

The host is a hydrocarbon material. Useful hosts include hydrocarbon materials. Useful co-hosts include nonpolar materials as described by Young et al., in U.S. Pat. No. 6,720,090, which is incorporated herein by reference. Useful co-hosts may also include polar materials.

Typical classes of hydrocarbon materials include those with four or more or suitably six or more aromatic ring groups, typically including fused ring benzenoid groups of three or more rings. Suitable examples are those based on one or more of the following: benzene, naphthalene, anthracene, phenanthrene, tetracene, pyrene, pentacene, perylene, coronene, chrysene, picene, pericyclene, and fluoranthene groups.

In one embodiment the hydrocarbon host is an anthracene group. Particularly useful hosts are those of Formula (4).

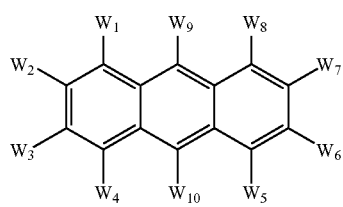

(4)

In Formula (4), $W_1$-$W_{10}$ independently represent hydrogen or an independently selected substituent, provided that two adjacent substituents can combine to form rings. In one aspect of the invention, $W^9$ and $W^{10}$ represent independently selected naphthyl groups or biphenyl groups. For example, $W^9$ and $W^{10}$ may represent such groups as 1-naphthyl, 2-naphthyl, 4-biphenyl, and 3-biphenyl. In another desirable embodiment, at least one of $W^9$ and $W^{10}$ represents an anthracene group. In a further aspect of the invention, $W^1$-$W^8$ represent hydrogen.

The hydrocarbon host can be present as the only host or it can be mixed with other hydrocarbon host materials. The hydrocarbon host may also be mixed with other nonhydrocarbon host materials, but when this is the case the hydrocarbon host material(s) should constitute at least 30%, 40%, 50% or even 60% or more of the layer by volume.

Illustrative examples of useful hydrocarbon hosts are shown below.

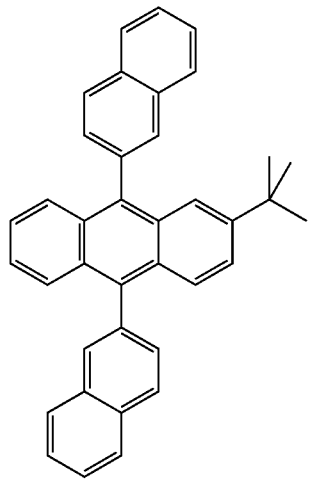

H-1

-continued

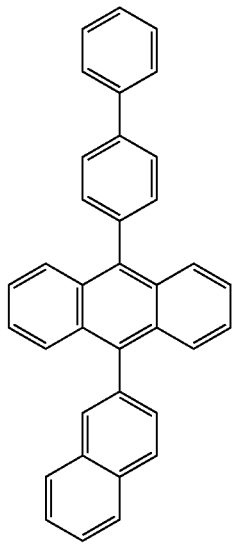

H-2

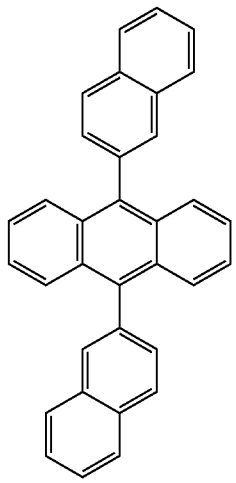

H-3

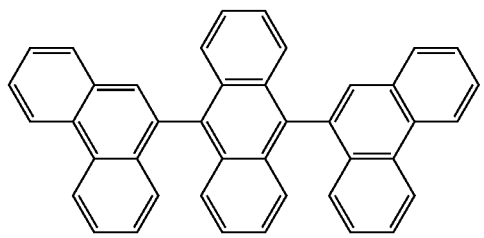

H-4

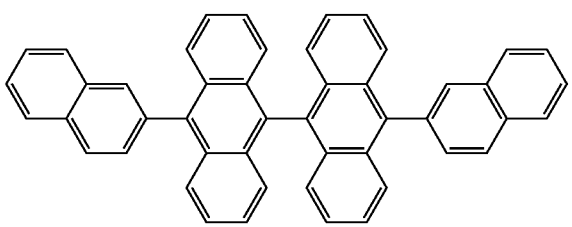

H-5

-continued
H-6
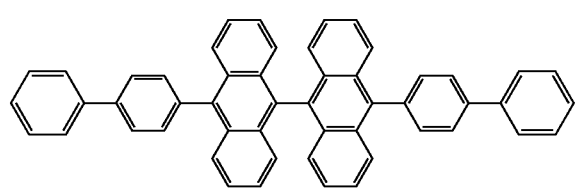
H-7
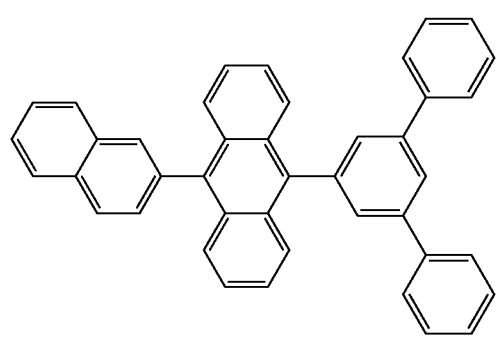
H-8
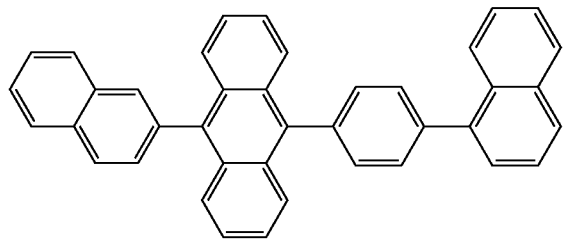
H-9
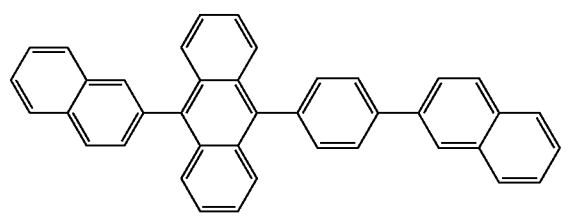
H-10
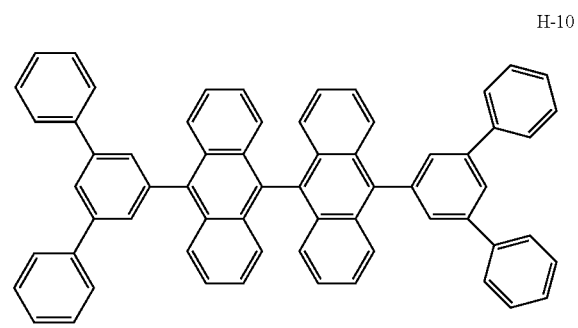
-continued
H-11
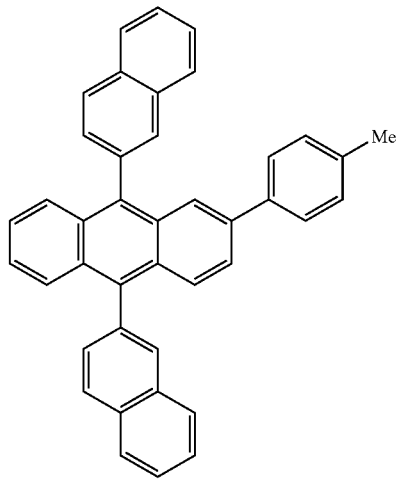
H-12
H-13
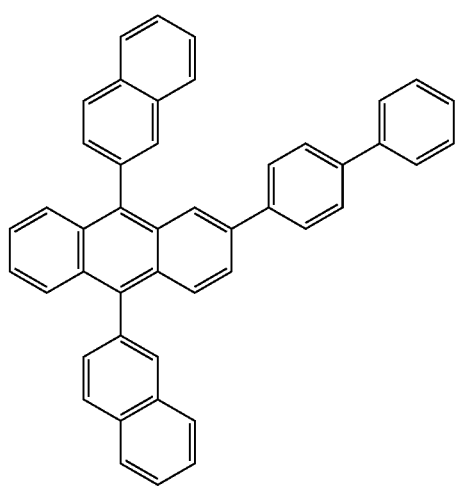

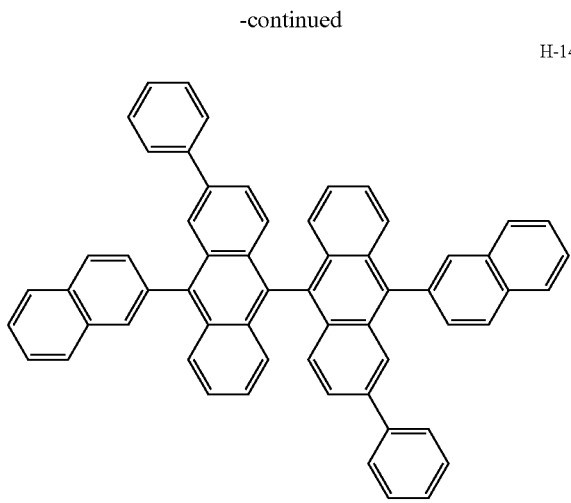

H-14

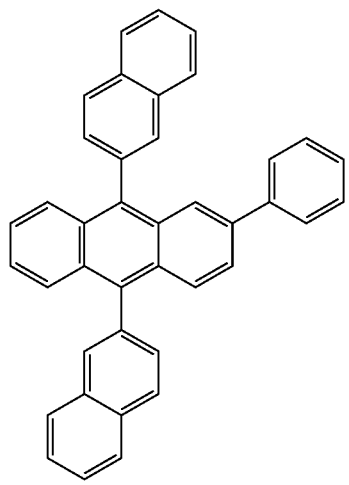

H-15

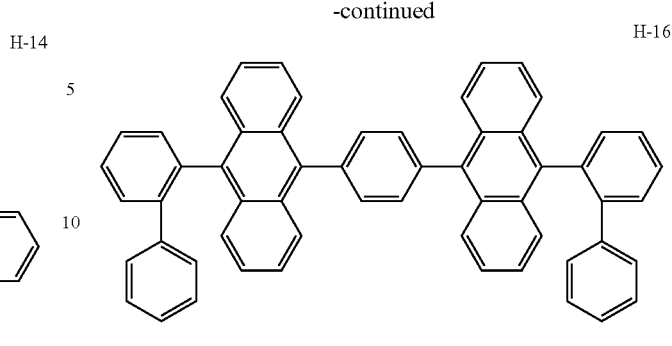

H-16

In one embodiment of the invention, the device includes a second light-emitting layer, including at least one host material and at least one light-emitting material. Suitably, the host in the second layer may be a nonhydrocarbon host, such as Alq. In another embodiment, the host material in this layer may be a hydrocarbon host that comprises 30%, 40%, 50% or more of the second light-emitting layer. Suitably, the primary host, that is the host that is present in the greatest amount, of the first light-emitting layer and that of the second light-emitting layer may be the same.

In a further aspect of the invention, the light-emitting material of Formula (1) emits yellow light and at least one light-emitting material, in the second light-emitting layer, emits blue light. Suitably, in this aspect, the inventive device emits white light or light that can be corrected by means of filtration to give white light. For a discussion of color and its measurement see R. W. G. Hunt, *Measuring Colour*, $3^{rd}$ Edition, Fountain Press, England (1998).

Many fluorescent materials that emit blue light are known in the art. Particularly useful classes of blue emitters include perylene and its derivatives such as a perylene nucleus bearing one or more substituents such as an alkyl group or an aryl group. A desirable perylene derivative for use as a blue emitting material is 2,5,8,11-tetra-t-butylperylene.

Another useful class of fluorescent materials includes blue-light emitting derivatives of distyrylarenes such as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Illustrative examples include those listed below.

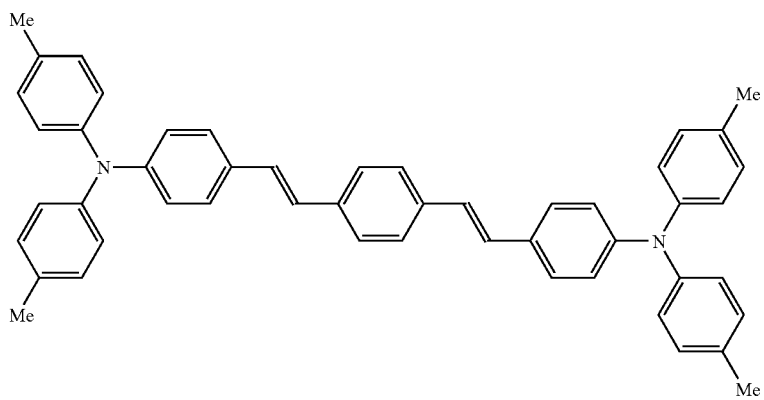

-continued

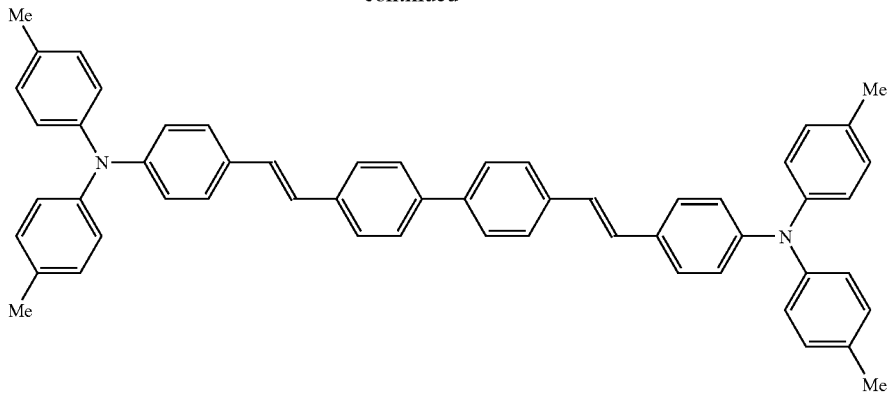

Another useful class of blue emitters comprise a boron atom, such as those described in US 2003/0201415. Illustrative examples of useful boron-containing blue fluorescent materials are listed below.

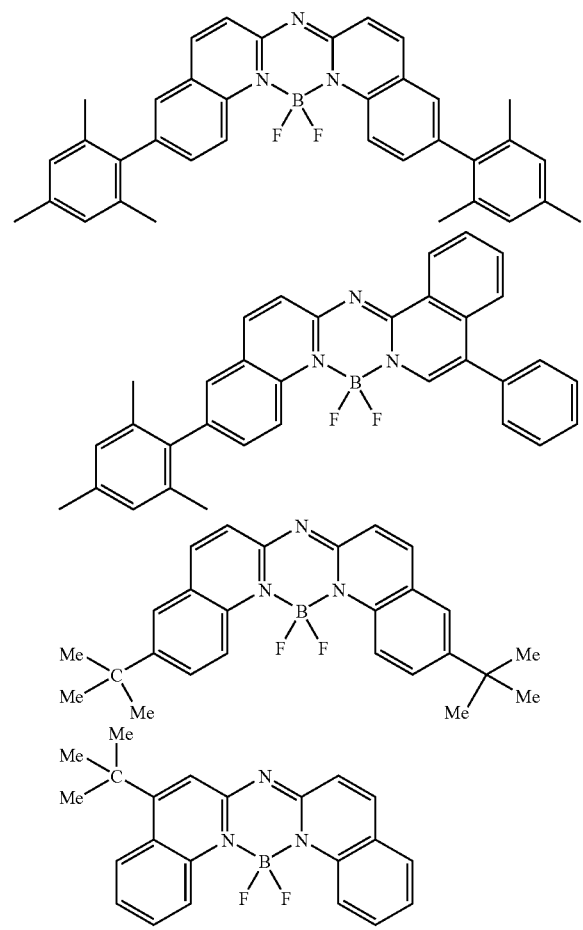

Unless otherwise specifically stated, use of the term "substituted" or "substituent" means any group or atom other than hydrogen. Additionally, when a group, compound or formula containing a substitutable hydrogen is referred to or when the term "group" is used, it is intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxopyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl) carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl] sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in many EL device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure according to the present invention and especially useful for a small molecule device, is shown in the FIGURE and is comprised of a substrate 101, an anode 103, a hole-injecting layer 105, a hole-transporting layer 107, a light-emitting layer 109, an electron-transporting layer 111, and a cathode 113. These layers are described in detail below. Note that the substrate 101 may alternatively be located adjacent to the cathode 113, or the substrate 101 may actually constitute the anode 103 or cathode 113. The organic layers between the anode 103 and cathode 113 are conveniently referred to as the organic EL element. Also, the total combined thickness of the organic layers is desirably less than 500 nm. If the device includes phosphorescent material, a hole-blocking layer, located between the light-emitting layer and the electron-transporting layer, may be present.

The anode 103 and cathode 113 of the OLED are connected to a voltage/current source 150 through electrical conductors 160. The OLED is operated by applying a potential between the anode 103 and cathode 113 such that the anode 103 is at a more positive potential than the cathode 113. Holes are injected into the organic EL element from the anode 103 and electrons are injected into the organic EL element at the cathode 113. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

Substrate

The OLED device of this invention is typically provided over a supporting substrate 101 where either the cathode 113 or anode 103 can be in contact with the substrate 101. The electrode in contact with the substrate 101 is conveniently referred to as the bottom electrode. Conventionally, the bottom electrode is the anode 103, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 can be a complex structure comprising multiple layers of materials. This is typically the case for active matrix substrates wherein TFTs are provided below the OLED layers. It is still necessary that the substrate 101, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate 101 can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. For applications where EL emission is viewed only through the cathode 113, the transmissive characteristics of the anode 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Cathode

When light emission is viewed solely through the anode 103, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), the cathode being capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode 113 must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layer (HIL)

A hole-injecting layer 105 may be provided between anode 103 and hole-transporting layer 107. The hole-injecting layer can serve to improve the film formation property of subsequent organic layers and to facilitate injection of holes into the hole-transporting layer 107. Suitable materials for use in the hole-injecting layer 105 include, but are not limited to, porphyrinic compounds as described in U.S. Pat. No. 4,720,432, plasma-deposited fluorocarbon polymers as described in U.S. Pat. No. 6,208,075, and some aromatic amines, for example, MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1. A hole-injection layer is conveniently used in the present invention, and is desirably a plasma-deposited fluorocarbon polymer. The thickness of a hole-injection layer containing a plasma-deposited fluorocarbon polymer can be in the range of 0.2 nm to 15 nm and suitably in the range of 0.3 to 1.5 nm.

Hole-Transporting Layer (HTL)

While not always necessary, it is often useful to include a hole-transporting layer in an OLED device. The hole-transporting layer 107 of the organic EL device contains at least one hole-transporting compound such as an aromatic tertiary amine. An aromatic tertiary amine is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines is those which include at least two aromatic tertiary amine moieties as described in U.S. Pat. No. 4,720,432 and U.S. Pat. No. 5,061,569. Such compounds include those represented by structural formula (A).

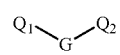

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

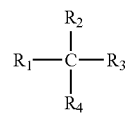

B where
R₁ and R₂ each independently represents a hydrogen atom, an aryl group, or an alkyl group or R₁ and R₂ together represent the atoms completing a cycloalkyl group; and
R₃ and R₄ each independently represents an aryl group, which is in turn substituted with a diaryl substituted amino group, as indicated by structural formula (C):

C wherein R₅ and R₆ are independently selected aryl groups. In one embodiment, at least one of R₅ or R₆ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

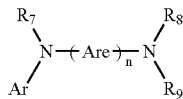

D wherein
each Are is an independently selected arylene group, such as a phenylene or anthracene moiety,
n is an integer of from 1 to 4, and
Ar, R₇, R₈, and R₉ are independently selected aryl groups.
In a typical embodiment, at least one of Ar, R₇, R₈, and R₉ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single tertiary amine compound or a mixture of such compounds. Specifically, one may employ a triarylamine, such as a triarylamine satisfying the formula (B), in combination with a tetraaryldiamine, such as indicated by formula (D). Illustrative of useful aromatic tertiary amines are the following:

1,1-Bis(4-di-p-tolylaminophenyl)cyclohexane (TAPC)
1,1-Bis(4-di-p-tolylaminophenyl)-4-methylcyclohexane
1,1-Bis(4-di-p-tolylaminophenyl)-4-phenylcyclohexane
1,1-Bis(4-di-p-tolylaminophenyl)-3-phenylpropane (TAPPP)
N,N,N',N'-tetraphenyl-4,4'''-diamino-1,1':4',1'':4'',1'''-quaterphenyl
Bis(4-dimethylamino-2-methylphenyl)phenylmethane
1,4-bis[2-[4-[N,N-di(p-toly)amino]phenyl]vinyl]benzene (BDTAPVB)
N,N,N',N'-Tetra-p-tolyl-4,4'-diaminobiphenyl (TTB)
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis{N-phenyl-N-[4-(1-naphthyl)-phenyl]amino}biphenyl
2,6-Bis[N,N-di(2-naphthyl)amino]fluorene
4,4',4''-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS. It is also possible for the hole-transporting layer to comprise two or more sublayers of differing compositions, the composition of each sublayer being as described above. The thickness of the hole-transporting layer can be between 10 and about 500 nm and suitably between 50 and 300 nm.

Light-Emitting Layer (LEL)

The light-emitting layer has been described previously. As also described previously, more than one light-emitting layer may be present. Useful hosts for the second light-emitting layer and some useful hosts and co-hosts for the first light-emitting layer are described below.

As more fully described in U.S. Pat. Nos. 4,769,292 and 5,935,721, the light-emitting layer (LEL) of the organic EL element includes a luminescent material where electroluminescence is produced as a result of electron-hole pair recombination. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. Fluorescent emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small-molecule emitting materials can be molecularly dispersed into a polymeric host, or the emitting materials can be added by copolymerizing a minor constituent into a host polymer. Host materials may be mixed together in order to improve film formation, electrical properties, light emission efficiency, operating lifetime, or manufacturability. The host may comprise a material that has good hole-transporting properties and a material that has good electron-transporting properties.

An important relationship for choosing a fluorescent material as a guest emitting material is a comparison of the excited singlet-state energies of the host and the fluorescent material. It is highly desirable that the excited singlet-state energy of the fluorescent material be lower than that of the host material. The excited singlet-state energy is defined as the difference in energy between the emitting singlet state and the ground state. For non-emissive hosts, the lowest excited state of the same electronic spin as the ground state is considered the emitting state.

Host and emitting materials known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives, also known as metal-chelated oxinoid compounds (Formula E), constitute one class of useful host compounds capable of supporting electroluminescence, and are particularly suitable for light emission of wavelengths longer than 500 nm, e.g., green, yellow, orange, and red.

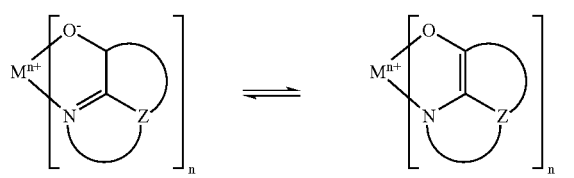

(E)

wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; a trivalent metal, such aluminum or gallium, or another metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-□-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

Derivatives of 9,10-di-(2-naphthyl)anthracene (Formula F1) constitute one class of useful host materials capable of supporting electroluminescence, and are particularly suitable for light emission of wavelengths longer than 400 nm, e.g., blue, green, yellow, orange or red.

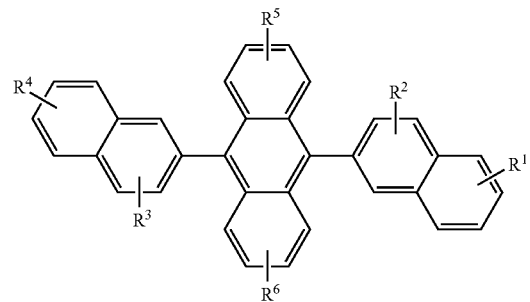

(F1)

wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene.

Other anthracene derivatives can be useful as a host in the LEL, including derivatives of 9,10-bis[4-(2,2-diphenylethenyl)phenyl]anthracene.

The monoanthracene derivative of Formula (F2) is also a useful host material capable of supporting electroluminescence, and are particularly suitable for light emission of wavelengths longer than 400 nm, e.g., blue, green, yellow, orange or red. Anthracene derivatives of Formula (F3) are described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference,

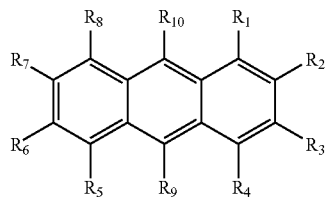

(F2)

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general formula (F3)

A1-L-A2      (F3)

wherein A1 and A2 each represent a substituted or unsubstituted monophenyl-anthryl group or a substituted or unsubstituted diphenylanthryl group and can be the same with or different from each other and L represents a single bond or a divalent linking group.

Another useful class of anthracene derivatives is represented by general formula (F4)

A3-An-A4      (F4)

wherein An represents a substituted or unsubstituted divalent anthracene residue group, A3 and A4 each represent a substituted or unsubstituted monovalent condensed aromatic ring group or a substituted or unsubstituted non-condensed ring aryl group having 6 or more carbon atoms and can be the same with or different from each other.

Asymmetric anthracene derivatives as disclosed in U.S. Pat. No. 6,465,115 and WO 2004/018587 are useful hosts and these compounds are represented by general formulas (F5) and (F6) shown below, alone or as a component in a mixture

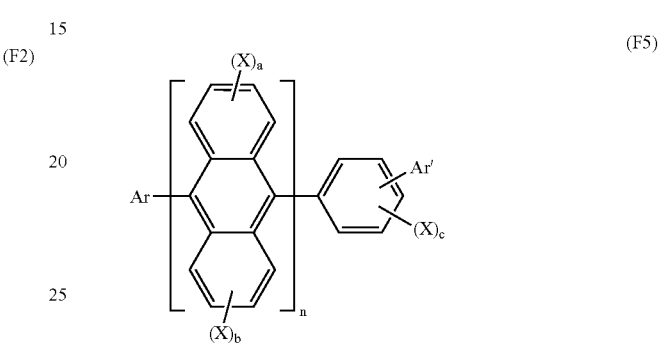

(F5)

wherein:

Ar is an (un)substituted condensed aromatic group of 10-50 nuclear carbon atoms;

Ar' is an (un)substituted aromatic group of 6-50 nuclear carbon atoms;

X is an (un)substituted aromatic group of 6-50 nuclear carbon atoms, (un)substituted aromatic heterocyclic group of 5-50 nuclear carbon atoms, (un)substituted alkyl group of 1-50 carbon atoms, (un)substituted alkoxy group of 1-50 carbon atoms, (un)substituted aralkyl group of 6-50 carbon atoms, (un)substituted aryloxy group of 5-50 nuclear carbon atoms, (un)substituted arylthio group of 5-50 nuclear carbon atoms, (un)substituted alkoxycarbonyl group of 1-50 carbon atoms, carboxy group, halogen atom, cyano group, nitro group, or hydroxy group;

a, b, and c are whole numbers of 0-4; and n is a whole number of 1-3;

and when n is 2 or more, the formula inside the parenthesis shown below can be the same or different.

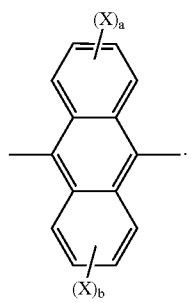

Furthermore, the present invention provides anthracene derivatives represented by general formula (F6) shown below

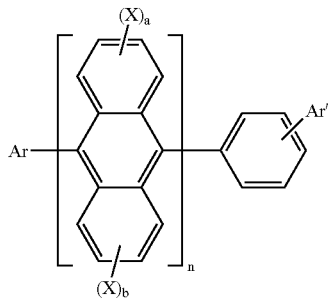

(F6)

wherein:
- Ar is an (un)substituted condensed aromatic group of 10-50 nuclear carbon atoms;
- Ar' is an (un)substituted aromatic group of 6-50 nuclear carbon atoms;
- X is an (un)substituted aromatic group of 6-50 nuclear carbon atoms, (un)substituted aromatic heterocyclic group of 5-50 nuclear carbon atoms, (un)substituted alkyl group of 1-50 carbon atoms, (un)substituted alkoxy group of 1-50 carbon atoms, (un)substituted aralkyl group of 6-50 carbon atoms, (un)substituted aryloxy group of 5-50 nuclear carbon atoms, (un)substituted arylthio group of 5-50 nuclear carbon atoms, (un)substituted alkoxycarbonyl group of 1-50 carbon atoms, carboxy group, halogen atom, cyano group, nitro group, or hydroxy group;
- a, b, and c are whole numbers of 0-4; and n is a whole number of 1-3; and
- when n is 2 or more, the formula inside the parenthesis shown below can be the same or different

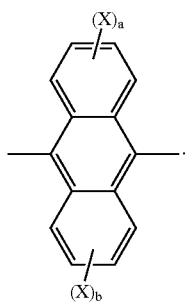

Specific examples of useful anthracene materials for use in a light-emitting layer include

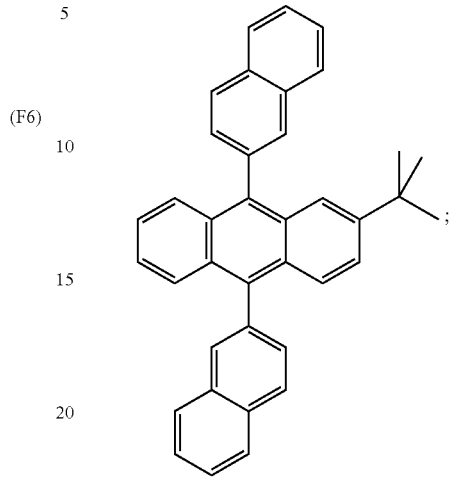

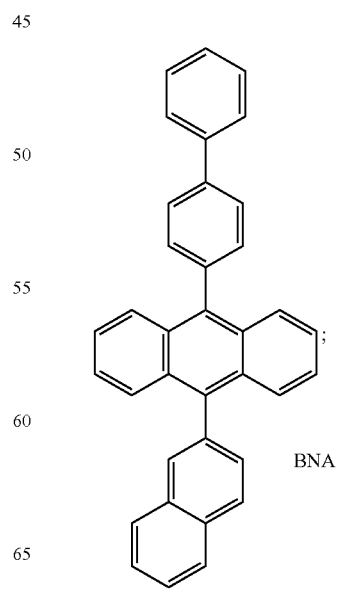

BNA

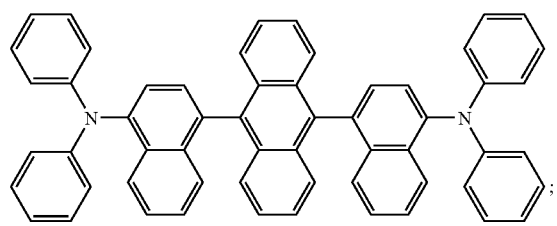

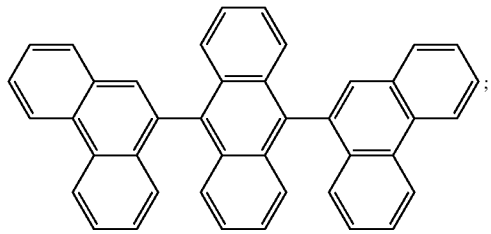

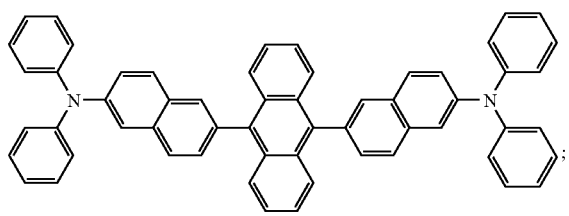

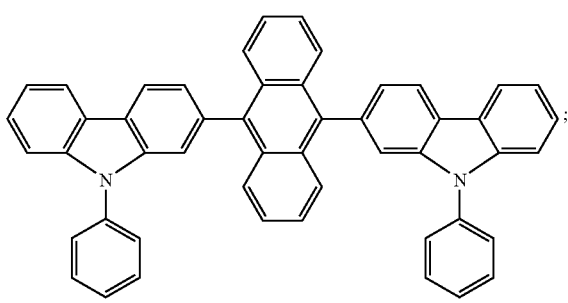

; or.

Benzazole derivatives (Formula G) constitute another class of useful host materials capable of supporting electroluminescence, and are particularly suitable for light emission of wavelengths longer than 400 nm, e.g., blue, green, yellow, orange or red.

$$(G)$$

wherein:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which connects the multiple benzazoles together. L may be either conjugated with the multiple benzazoles or not in conjugation with them. An example of a useful benzazole is 2,2',2"-(1,3,5-phenylene)tris[1-phenyl-1H-benzimidazole].

Styrylarylene derivatives as described in U.S. Pat. No. 5,121,029 and JP 08333569 are also useful hosts for blue emission. For example, 9,10-bis[4-(2,2-diphenylethenyl)phenyl]anthracene and 4,4'-bis(2,2-diphenylethenyl)-1,1'-biphenyl (DPVBi) are useful hosts for blue emission.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)imine boron compounds, bis(azinyl)methene compounds, and carbostyryl compounds. Illustrative examples of useful materials include, but are not limited to, the following:

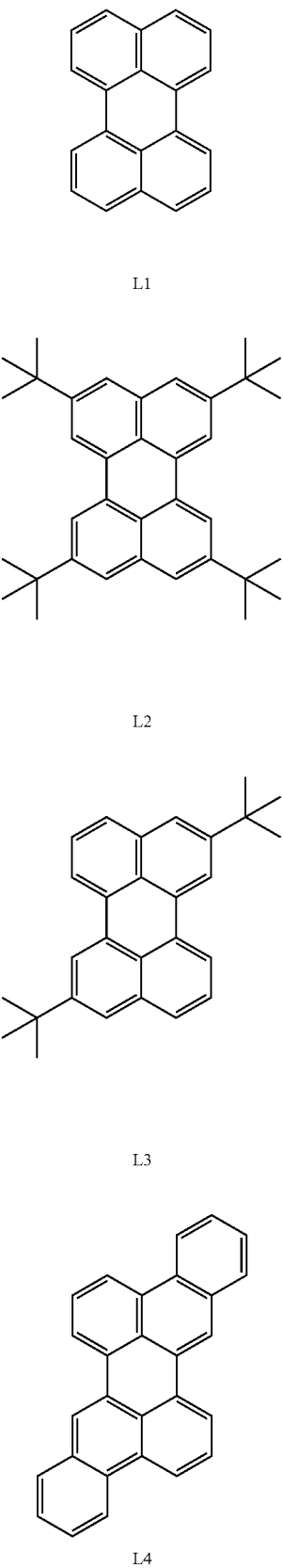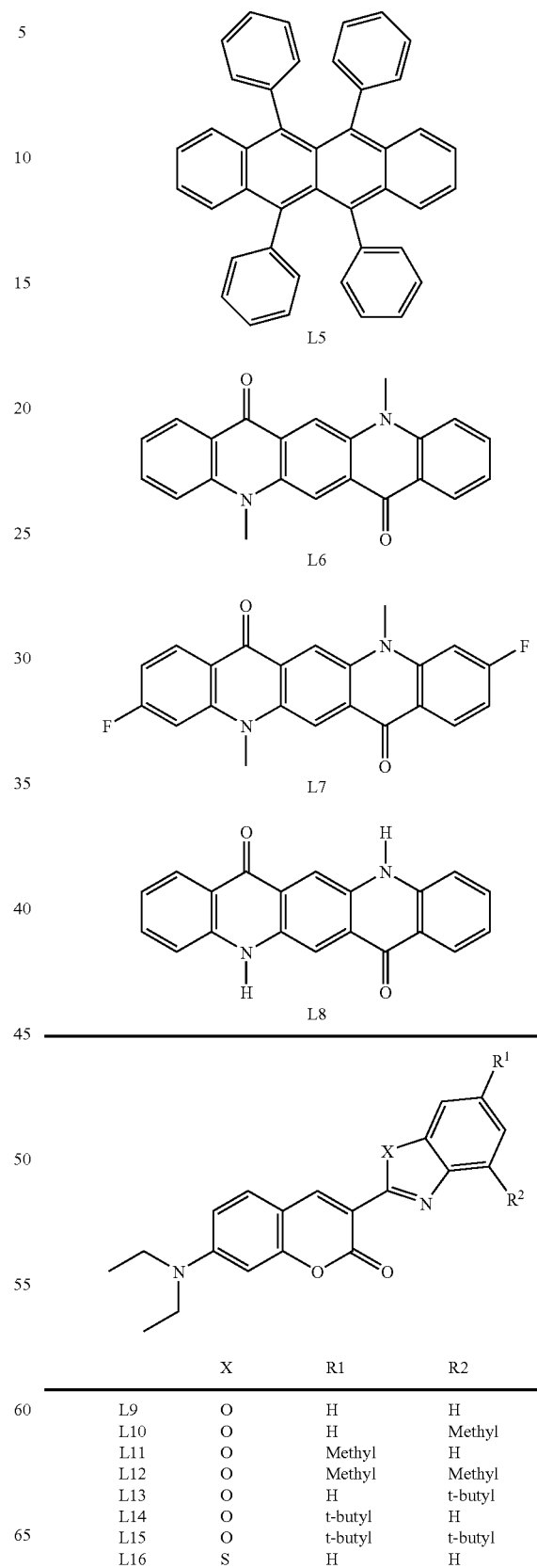

-continued
| | | | |
|---|---|---|---|
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
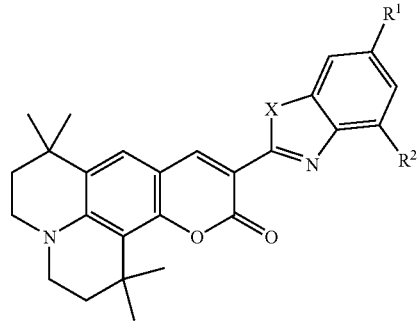
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
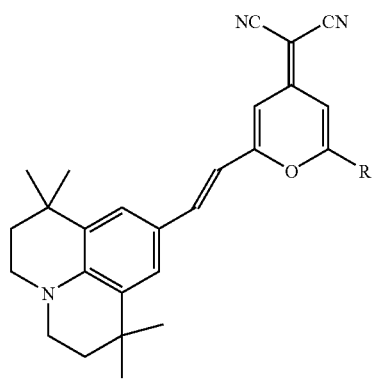
| | R |
|---|---|
| L37 | phenyl |
| L38 | methyl |
| L39 | t-butyl |
| L40 | mesityl |
-continued
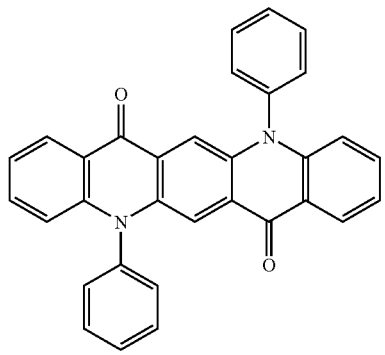
| | R |
|---|---|
| L41 | phenyl |
| L42 | methyl |
| L43 | t-butyl |
| L44 | mesityl |
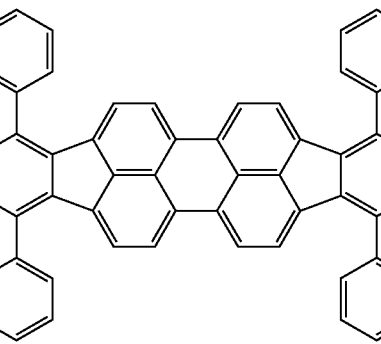
L45
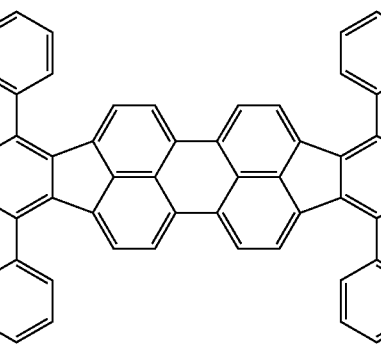
L46

-continued
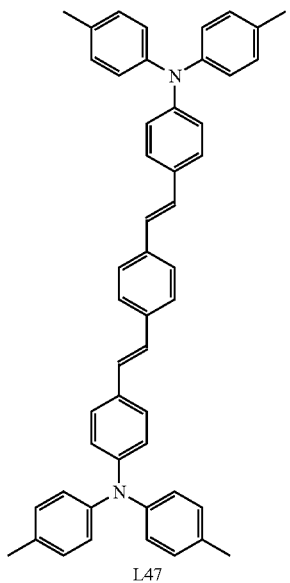
L47
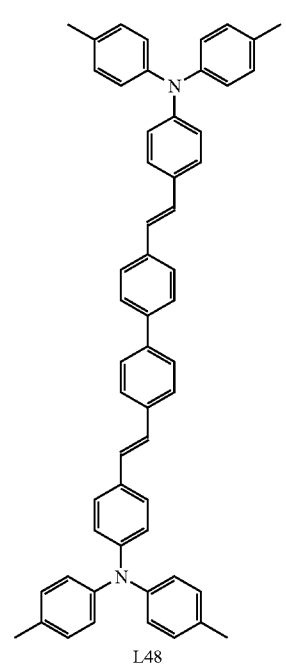
L48
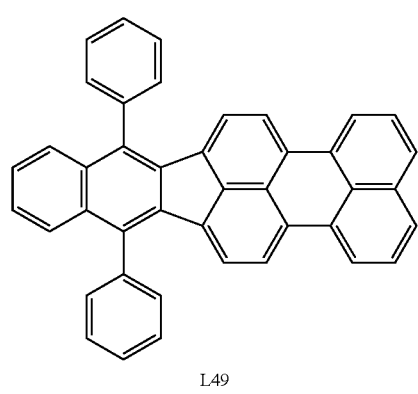
L49
-continued
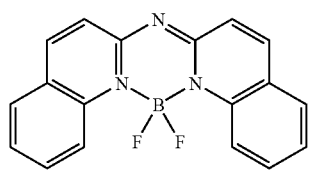
L50
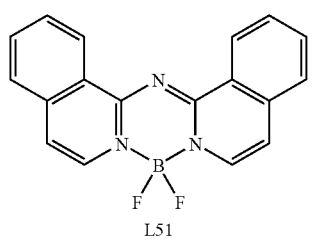
L51
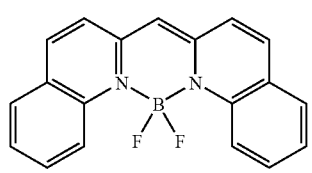
L52
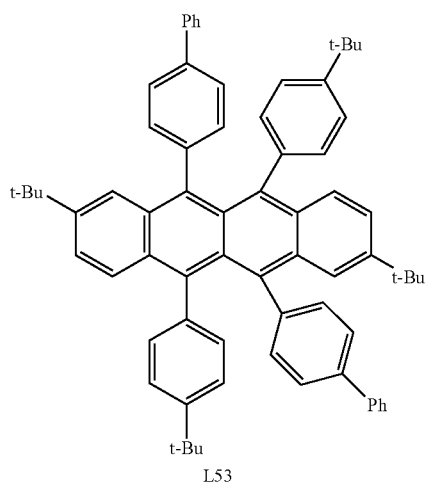
L53
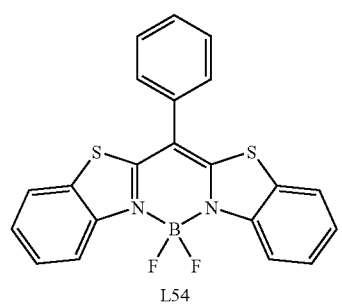
L54

-continued

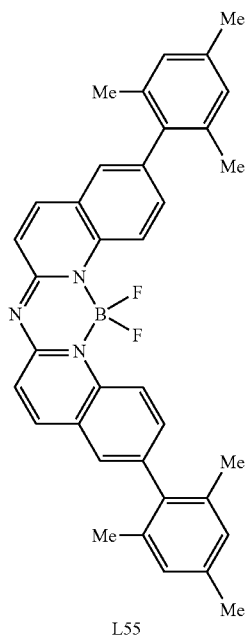

L55

Light-emitting phosphorescent materials may be used in the EL device. For convenience, the phosphorescent complex guest material may be referred to herein as a phosphorescent material. The phosphorescent material typically includes one or more ligands, for example monoanionic ligands that can be coordinated to a metal through an $sp^2$ carbon and a heteroatom. Conveniently, the ligand can be phenylpyridine (ppy) or derivatives or analogs thereof. Examples of some useful phosphorescent organometallic materials include tris(2-phenylpyridinato-N,$C^{2'}$)iridium(III), bis(2-phenylpyridinato-N,$C^2$)iridium(III)(acetylacetonate), and bis(2-phenylpyridinato-N,$C^{2'}$)platinum(II). Usefully, many phosphorescent organometallic materials emit in the green region of the spectrum, that is, with a maximum emission in the range of 510 to 570 nm.

Phosphorescent materials may be used singly or in combinations other phosphorescent materials, either in the same or different layers. Phosphorescent materials and suitable hosts are described in WO 00/57676, WO 00/70655, WO 01/41512 A1, WO 02/15645 A1, US 2003/0017361 A1, WO 01/93642 A1, WO 01/39234 A2, U.S. Pat. No. 6,458,475 B1, WO 02/071813 A1, U.S. Pat. No. 6,573,651 B2, US 2002/0197511 A1, WO 02/074015 A2, U.S. Pat. No. 6,451,455 B1, US 2003/0072964 A1, US 2003/0068528 A1, U.S. Pat. No. 6,413,656 B1, U.S. Pat. No. 6,515,298 B2, U.S. Pat. No. 6,451,415 B1, U.S. Pat. No. 6,097,147, US 2003/0124381 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, US 2003/0141809 A1, US 2003/0040627 A1, JP 2003059667A, JP 2003073665A, and US 2002/0121638 A1.

The emission wavelengths of cyclometallated Ir(III) complexes of the type $IrL_3$ and $IrL_2L'$, such as the green-emitting fac-tris(2-phenylpyridinato-N,$C^{2'}$)iridium(III) and bis(2-phenylpyridinato-N,$C^{2'}$)iridium(III)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N, $C^{3'}$)iridium(III)(acetylacetonate) and tris(2-phenylisoquinolinato-N,C)iridium(III). A blue-emitting example is bis(2-(4,6-difluorophenyl)-pyridinato-N,$C^{2'}$)iridium(III) (picolinate).

Red electrophosphorescence has been reported, using bis(2-(2'-benzo[4,5-a]thienyl)pyridinato-N,$C^3$) iridium (acetylacetonate) [$Btp_2Ir(acac)$] as the phosphorescent material (C. Adachi, S. Lamansky, M. A. Baldo, R. C. Kwong, M. E. Thompson, and S. R. Forrest, App. Phys. Lett., 78, 1622-1624 (2001)).

Other important phosphorescent materials include cyclometallated Pt(II) complexes such as cis-bis(2-phenylpyridinato-N,$C^{2'}$)platinum(II), cis-bis(2-(2'-thienyl)pyridinato-N, $C^{3'}$) platinum(II), cis-bis(2-(2'-thienyl)quinolinato-N,$C^{5'}$) platinum(II), or (2-(4,6-difluorophenyl)pyridinato-N,$C^{2'}$) platinum (II) (acetylacetonate). Pt (II) porphyrin complexes such as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as $Tb^{3+}$ and $Eu^{3+}$ (J. Kido et al., Appl. Phys. Lett., 65, 2124 (1994)).

Suitable host materials for phosphorescent materials should be selected so that transfer of a triplet exciton can occur efficiently from the host material to the phosphorescent material but cannot occur efficiently from the phosphorescent material to the host material. Therefore, it is highly desirable that the triplet energy of the phosphorescent material be lower than the triplet energy of the host. Generally speaking, a large triplet energy implies a large optical bandgap. However, the band gap of the host should not be chosen so large as to cause an unacceptable barrier to injection of charge carriers into the light-emitting layer and an unacceptable increase in the drive voltage of the OLED. Suitable host materials are described in WO 00/70655 A2; 01/39234 A2; 01/93642 A1; 02/074015 A2; 02/15645 A1, and US 20020117662. Suitable hosts include certain aryl amines, triazoles, indoles and carbazole compounds. Examples of desirable hosts are 4,4'-N,N'-dicarbazole-biphenyl, otherwise known as 4,4'-bis(carbazol-9-yl)biphenyl or CBP; 4,4'-N,N'-dicarbazole-2,2'-dimethyl-biphenyl, otherwise known as 2,2'-dimethyl-4,4'-bis(carbazol-9-yl)biphenyl or CDBP; 1,3-bis(N,N'-dicarbazole)benzene, otherwise known as 1,3-bis(carbazol-9-yl)benzene, and poly(N-vinylcarbazole), including their derivatives.

Desirable host materials are capable of forming a continuous film.

Hole-Blocking Layer (HBL)

In addition to suitable hosts, an OLED device employing a phosphorescent material often requires at least one hole-blocking layer placed between the electron-transporting layer 111 and the light-emitting layer 109 to help confine the excitons and recombination events to the light-emitting layer comprising the host and phosphorescent material. In this case, there should be an energy barrier for hole migration from the host into the hole-blocking layer, while electrons should pass readily from the hole-blocking layer into the light-emitting layer comprising a host and a phosphorescent material. The first requirement entails that the ionization potential of the hole-blocking layer be larger than that of the light-emitting layer 109, desirably by 0.2 eV or more. The second requirement entails that the electron affinity of the hole-blocking layer not greatly exceed that of the light-emitting layer 109, and desirably be either less than that of light-emitting layer or not exceed that of the light-emitting layer by more than about 0.2 eV.

When used with an electron-transporting layer whose characteristic luminescence is green, such as an Alq-containing electron-transporting layer as described below, the requirements concerning the energies of the highest occupied molecular orbital (HOMO) and lowest unoccupied molecular orbital (LUMO) of the material of the hole-blocking layer frequently result in a characteristic luminescence of the hole-blocking layer at shorter wavelengths than that of the electron-transporting layer, such as blue, violet, or ultraviolet luminescence. Thus, it is desirable that the characteristic luminescence of the material of a hole-blocking layer be blue, violet, or ultraviolet. It is further desirable, but not absolutely required, that the triplet energy of the hole-blocking material be greater than that of the phosphorescent material. Suitable hole-blocking materials are described in WO 00/70655A2 and WO 01/93642 A1. Two examples of useful hole-blocking materials are bathocuproine (BCP) and bis(2-methyl-8-quinolinolato)(4-phenylphenolato)aluminum(III) (BAlq). The characteristic luminescence of BCP is in the ultraviolet, and that of BAlq is blue. Metal complexes other than BAlq are also known to block holes and excitons as described in US 20030068528. In addition, US 20030175553 A1 describes the use of fac-tris(1-phenylpyrazolato-N,$C^{2'}$)iridium(III) (Irppz) for this purpose.

When a hole-blocking layer is used, its thickness can be between 2 and 100 nm and suitably between 5 and 10 nm.

Electron-Transporting Layer (ETL)

Desirable thin film-forming materials for use in forming the electron-transporting layer 111 of the organic EL devices of this invention are metal-chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary of contemplated oxinoid compounds are those satisfying structural formula (E), previously described.

Other electron-transporting materials suitable for use in the electron-transporting layer 111 include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

If both a hole-blocking layer and an electron-transporting layer 111 are used, electrons should pass readily from the electron-transporting layer 111 into the hole-blocking layer. Therefore, the electron affinity of the electron-transporting layer 111 should not greatly exceed that of the hole-blocking layer. Desirably, the electron affinity of the electron-transporting layer should be less than that of the hole-blocking layer or not exceed it by more than about 0.2 eV.

If an electron-transporting layer is used, its thickness may be between 2 and 100 nm and suitably between 5 and 20 nm.

Other Useful Organic Layers and Device Architecture

In some instances, layers 109 through 111 can optionally be collapsed into a single layer that serves the function of supporting both light emission and electron transportation. The hole-blocking layer, when present, and layer 111 may also be collapsed into a single layer that functions to block holes or excitons, and supports electron transport. It also known in the art that emitting materials may be included in the hole-transporting layer 107. In that case, the hole-transporting material may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182 and can be equipped with a suitable filter arrangement to produce a color emission.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Organic materials useful in making OLEDs, for example organic hole-transporting materials, organic light-emitting materials doped with an organic electroluminescent components have relatively complex molecular structures with relatively weak molecular bonding forces, so that care must be taken to avoid decomposition of the organic material(s) during physical vapor deposition. The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition: These powders, flakes, or granules are difficult to handle. These organic materials generally have a relatively low physical density and undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; This can lead to non-uniform heating of such organic materials in physical vapor deposition sources. Therefore, result in potentially nonuniform vapor-deposited organic layers formed on a substrate.

These organic powders can be consolidated into a solid pellet. These solid pellets consolidating into a solid pellet from a mixture of a sublimable organic material powder are easier to handle. Consolidation of organic powder into a solid pellet can be accomplished with relatively simple tools. A solid pellet formed from mixture comprising one or more non-luminescent organic non-electroluminescent component materials or luminescent electroluminescent component materials or mixture of non-electroluminescent component and electroluminescent component materials can be placed into a physical vapor deposition source for making organic layer. Such consolidated pellets can be used in a physical vapor deposition apparatus.

In one aspect, the present invention provides a method of making an organic layer from compacted pellets of organic materials on a substrate, which will form part of an OLED.

One preferred method for depositing the materials of the present invention is described in US 2004/0255857 and U.S. Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. No. 10/784,585; U.S. Ser. No. 10/805,980; U.S. Ser. No. 10/945,940; U.S. Ser. No. 10/945,941; U.S. Ser. No. 11/050,924; and U.S. Ser. No. 11/050,934. Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOX, Teflon, and alternating inorganic/polymeric layers are known in the art for encapsulation. Any of these methods of sealing or encapsulation and desiccation can be used with the EL devices constructed according to the present invention.

Optical Optimization

OLED devices of this invention can employ various well-known optical effects in order to enhance their emissive properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the EL device or as part of the EL device.

Embodiments of the invention may provide advantageous features such as higher luminous yield, lower drive voltage, and higher power efficiency, longer operating lifetimes or ease of manufacture. Embodiments of devices useful in the invention can provide a wide range of hues including those useful in the emission of white light (directly or through filters to provide multicolor displays). Embodiments of the invention can also provide an area lighting device.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

EXAMPLE 1

Synthesis of Inv-1

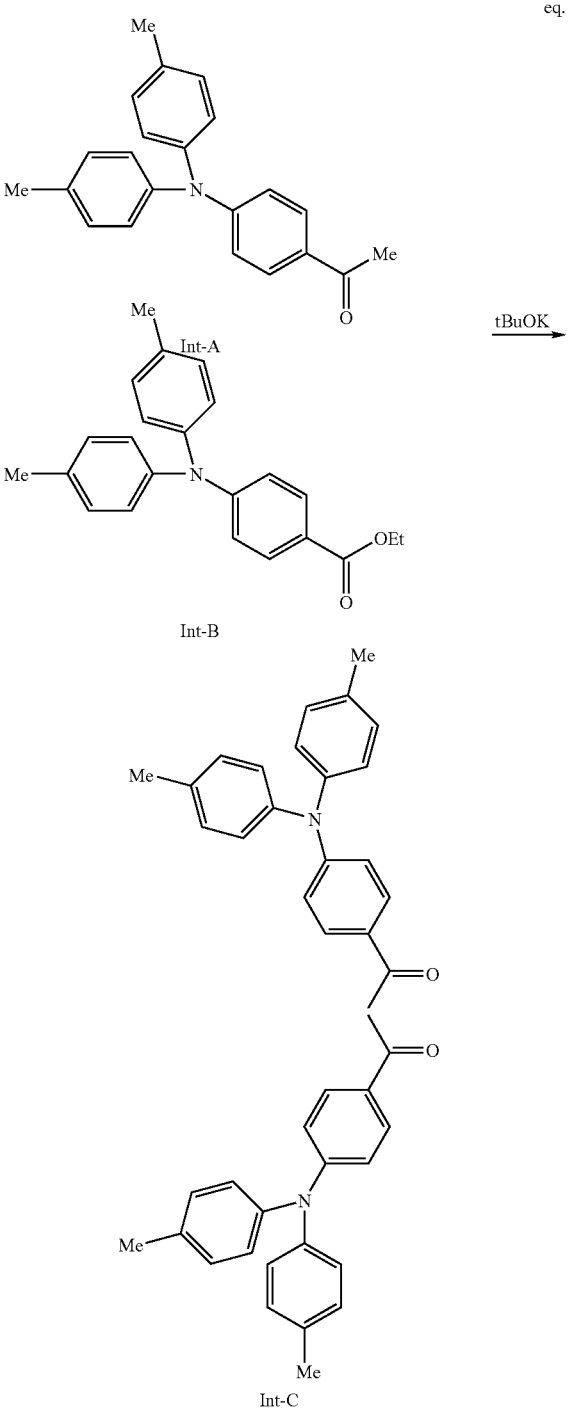

-continued

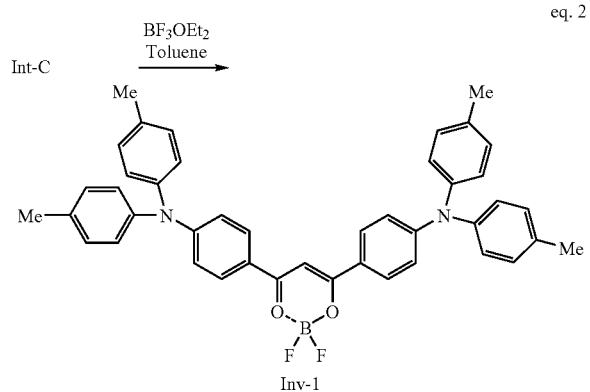

eq. 2

Inv-1

Inv-1 was prepared according to eq. 1 and eq. 2. Int-A (2.0 g, 6.3 mmol) was dissolved in 30 mL of dimethylformamide with slight warming to give a yellow solution. Potassium t-butoxide (1.1 g, 9.4 mMol) was added and the mixture was stirred for 10 min. Int-B (2.2 g, 6.3 mmol) was added and the reaction was stirred for 1 h; the color turned from black to yellow. After 1 h, ethyl acetate was added and the reaction mixture was washed with water and then with 50 mL of 2N HCl solution. The organic layer was separated, dried over $MgSO_4$ and concentrated to dryness to give a yellow foam. The product was purified by column chromatography (silica gel, 1/1 methylene chloride/heptane eluent). The product, Int-C, was collected and recrystallized from ethyl acetate to give a bright yellow solid (0.8 g, m.p. 190° C.). This procedure was repeated to obtain additional amounts of Int-C.

Int-C (4 g, 6.5 mMol) was dissolved in 20 mL of toluene at room temperature and boron trifluoride etherate (1.1 g, 7.8 mMol) was added dropwise. The reaction turned dark red instantly. After stirring for 1 h, the mixture was washed with water. The organic layer was separated and dried over $MgSO_4$, filtered and concentrated to an oil.

The oil was dissolved in ethyl acetate and methanol was added to precipitate the product. The solid formed was collected and washed with methanol. The solid was purified by stirring it with a mixture of 30% ethyl acetate and 70% heptane for ½ h with slight heating. The dark green solid was collected, to afford 1.8 g of product; m.p. 143° C. The product was sublimed at 260-263° C. to afford Inv-1, m.p. 265° C.

EXAMPLE 2

Preparation of Devices 1-1 Through 1-6.

A series of EL devices (1-1 through 1-6) were constructed in the following manner.

1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 150 nm.
4. A 37.5 nm light-emitting layer (LEL) corresponding to the host material 2-t-butyl-9,10-di-(2-naphthyl)anthracene (H-1), 10-(4-biphenyl)-9-(2-naphthyl)anthracene (H-2) or NPB as listed in Table 1a and light-emitting material Inv-1 at the level shown in Table 1a was then deposited.
5. A 37.5 nm electron-transporting layer (ETL) of tris(8-quinolinolato)aluminum (III) (Alq) was vacuum-deposited over the LEL.
6. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

TABLE 1a

Material for the light-emitting layer in Example 2.

| Device | Host | Host Level | Inv-1 Level |
|---|---|---|---|
| 1-1 Inventive | H-1 | 99.5% | 0.5% |
| 1-2 Inventive | H-2 | 99.5% | 0.5% |
| 1-3 Comparative | NPB | 99.5% | 0.5% |
| 1-4 Inventive | H-1 | 99.0% | 1.0% |
| 1-5 Inventive | H-2 | 99.0% | 1.0% |
| 1-6 Comparative | NPB | 99.0% | 1.0% |

The cells thus formed were tested for luminous efficiency and color at an operating current of 20 $mA/cm^2$ and the results are reported in Table 1b in the form of efficiency (w/A), and 1931 CIE (Commission Internationale de L'Eclairage) coordinates.

The operational stability of each device, 1-1 through 1-6, was tested at a current density of 20 $mA/cm^2$ and a temperature of 70° C. The percent of luminance remaining after 242 hours relative to the initial luminance is reported in Table 1b as a measure of stability.

TABLE 1b

Evaluation results for Devices 1-1 through 1-6.

| Device | Host (Type) | CIEx | CIEy | Stability[1] | Relative Stability | Efficiency W/A | Relative Efficiency |
|---|---|---|---|---|---|---|---|
| 1-1 Inventive | H-1 (Hydrocarbon) | 0.366 | 0.416 | 64.2% | 107 | 0.048 | 282 |
| 1-2 Inventive | H-2 (Hydrocarbon) | 0.446 | 0.443 | 68.1% | 113 | 0.053 | 312 |

TABLE 1b-continued

Evaluation results for Devices 1-1 through 1-6.

| Device | Host (Type) | CIEx | CIEy | Stability[1] | Relative Stability | Efficiency W/A | Relative Efficiency |
|---|---|---|---|---|---|---|---|
| 1-3 Comparative | NPB (Amine) | 0.367 | 0.530 | 60.1% | 100 | 0.017 | 100 |
| 1-4 Inventive | H-1 (Hydrocarbon) | 0.486 | 0.469 | 68.1% | 113 | 0.072 | 379 |
| 1-5 Inventive | H-2 (Hydrocarbon) | 0.494 | 0.456 | 75.2% | 125 | 0.060 | 316 |
| 1-6 Comparative | NPB (Amine) | 0.419 | 0.50 | 60.4% | 100 | 0.019 | 100 |

[1] Percent luminance remaining after 242 h.

Table 1b lists evaluation results for devices in which Inv-1 is used at a level of 0.5% (Examples 1-1 through 1-3) or at 1.0% (Examples 1-4 through 1-7) in either a hydrocarbon or a non-hydrocarbon host. It can be seen from Table 1b that the inventive devices afford a good yellow color. They also afford better stability and much better luminance relative to the comparison devices.

EXAMPLE 3

Preparation of Comparative Devices 2-1 Through 2-4.

A series of EL devices (2-1 through 2-6) were constructed in the same manner as the devices in Example 2, except the host for the light-emitting layer was Alq (tris(8-quinolinolato)aluminum (III)) and the level of Inv-1 used is shown in Table 2.

The cells thus formed were tested for luminous efficiency and color at an operating current of 20 mA/cm$^2$ and the results are reported in Table 2 in the form of efficiency (w/A), and 1931 CIE coordinates.

TABLE 2

Evaluation results for Comparative Devices 2-1 through 2-4.

| Device | Host | Host Type | Inv-1 Level (%) | CIEx | CIEy | Efficiency W/A |
|---|---|---|---|---|---|---|
| 2-1 Comparative | Alq | Metal Complex | 1.0 | 0.534 | 0.445 | 0.037 |
| 2-2 Comparative | Alq | Metal Complex | 2.0 | 0.541 | 0.430 | 0.018 |
| 2-3 | Alq | Metal Complex | 3.0 | 0.605 | 0.381 | 0.042 |
| 2-4 Comparative | Alq | Metal Complex | 5.0 | 0.609 | 0.375 | 0.038 |

It can be seen from Table 2 that when Inv-1 is used with Alq as the host, the color is green rather than yellow and the luminance efficiency is low.

EXAMPLE 4

Preparation of Devices 3-1 Through 3-6.

A series of EL devices (3-1 through 3-6) were constructed in the same manner as the devices in Example 2, except the light-emitting material was Inv-2 at a level of 1% and the host for the light-emitting layer was Alq or H-1 or a mixture of the two as listed in Table 3.

The cells thus formed were tested for luminous efficiency and color at an operating current of 20 mA/cm$^2$ and the results are reported in Table 3 in the form of efficiency (w/A), and 1931 CIE coordinates.

The operational stability of each device, 3-1 through 3-6, was tested at a current density of 20 mA/cm$^2$ and a temperature of 70° C. The percent of luminance remaining relative to the initial luminance after 309 hours is reported in Table 3 as a measure of stability.

TABLE 3

Evaluation results for Devices 3-1 through 3-6.[1]

| Device | Host Alq | Host H-1 | CIEx | CIEy | Stability[2] | Relative Stability | Efficiency W/A | Relative Efficiency |
|---|---|---|---|---|---|---|---|---|
| 3-1 Comparative | 100 | 0 | 0.537 | 0.444 | 75.0 | 100 | 0.036 | 100 |
| 3-2 Comparative | 75 | 25 | 0.527 | 0.451 | 88.4 | 118 | 0.035 | 97 |
| 3-3 Inventive | 50 | 50 | 0.522 | 0.457 | 92.3 | 123 | 0.051 | 142 |
| 3-4 Inventive | 30 | 70 | 0.516 | 0.462 | 83.5 | 111 | 0.057 | 158 |

TABLE 3-continued

Evaluation results for Devices 3-1 through 3-6.[1]

| Device | Host Alq | Host H-1 | CIEx | CIEy | Stability[2] | Relative Stability | Efficiency W/A | Relative Efficiency |
|---|---|---|---|---|---|---|---|---|
| 3-5 Inventive | 10 | 90 | 0.507 | 0.470 | 77.4 | 103 | 0.060 | 167 |
| 3-6 Inventive | 0 | 100 | 0.499 | 0.474 | 81.1 | 108 | 0.067 | 186 |

[1]Includes light-emitting material Inv-2 at 1.0 volume % of the light-emitting layer.
[2]Percent luminance remaining after 309 h.

It can be seen in Table 3 that when the amount of hydrocarbon host exceeds 25%, the stability and efficiency are improved.

EXAMPLE 5

Preparation of Devices 4-1 through 4-6.

A series of EL devices (4-1 through 4-6) were constructed in the same manner as the devices in Example 2, except the light-emitting material was Inv-2 at a level shown in Table 4 and the host for the light-emitting layer was H-2 or NPB as listed in Table 4.

The cells thus formed were tested for luminous efficiency and color at an operating current of 20 mA/cm² and the results are reported in Table 4 in the form of efficiency (w/A), and 1931 CIE coordinates.

TABLE 4

Evaluation results for Devices 4-1 through 4-6.

| Example | Host | Inv-2 Level (%) | CIEx | CIEy | Efficiency W/A | Relative Efficiency |
|---|---|---|---|---|---|---|
| 4-1 Inventive | H-2 | 0.5 | 0.454 | 0.472 | 0.041 | 456 |
| 4-2 Inventive | H-2 | 1.0 | 0.496 | 0.468 | 0.044 | 489 |
| 4-3 Inventive | H-2 | 1.5 | 0.508 | 0.460 | 0.045 | 500 |
| 4-4 Comparative | NPB | 0.5 | 0.355 | 0.529 | 0.014 | 156 |
| 4-5 Comparative | NPB | 1.0 | 0.389 | 0.516 | 0.011 | 122 |
| 4-6 Comparative | NPB | 1.5 | 0.411 | 0.503 | 0.009 | 100 |

As can be seen from Table 4, Inv-2 affords much higher luminance and good color when used with the hydrocarbon host H-2 compared to the aromatic amine host NPB.

EXAMPLE 6

Preparation of Devices 5-1 Through 5-6.

A series of EL devices (5-1 through 5-6) having two light-emitting layers were constructed in the following manner.

1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material NPB was deposited to a thickness of 130 nm.
4. A 20 nm, first light-emitting layer (LEL-1), corresponding to the host material H-1 and the light-emitting material Inv-2 at the level shown in Table 5a was then deposited.
5. A second light-emitting layer (LEL-2), corresponding to the host material H-1, the light-emitting material 2,5,8,11-tetra-t-butyl perylene (TBP) at a level of 1.5%, and NPB at 5% by volume of the layer was then deposited to a thickness shown in Table 5a.
6. A 15 nm electron-transporting layer (ETL) of tris(8-quinolinolato)aluminum (III) (Alq) was vacuum-deposited over the LEL.
7. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

TABLE 5a

Format for Devices 5-1 through 5-6.

| Device | LEL-1 Host | Inv-2 Level | LEL-2 Host | LEL-2 Thickness | TBP Level |
|---|---|---|---|---|---|
| 5-1 Inventive | H-1 | 0.50% | H-1 | 200 | 1.5% |
| 5-2 Inventive | H-1 | 0.75% | H-1 | 200 | 1.5% |
| 5-3 Inventive | H-1 | 1.00% | H-1 | 200 | 1.5% |
| 5-4 Inventive | H-1 | 0.75% | H-1 | 250 | 1.5% |
| 5-5 Inventive | H-1 | 0.75% | H-1 | 375 | 1.5% |
| 5-6 Inventive | H-1 | 0.75% | H-1 | 450 | 1.5% |

The cells thus formed were tested for luminous efficiency and color at an operating current of 20 mA/cm² and the results are reported in Table 5b in the form of efficiency (w/A), and 1931 CIE coordinates. The operational stability of each device, 5-1 through 5-6, was tested at a current density of 20 mA/cm² and a temperature of 70° C. The percent of luminance remaining relative to the initial luminance after 239 hours is reported in Table 5b as a measure of stability.

TABLE 5b

Evaluation results for Devices 5-1 through 5-6.

| Device | CIEx | CIEy | Stability[1] | Efficiency W/A |
|---|---|---|---|---|
| 5-1 Inventive | 0.366 | 0.402 | 90.3% | 0.075 |
| 5-2 Inventive | 0.387 | 0.410 | 85.5% | 0.083 |
| 5-3 Inventive | 0.403 | 0.410 | 89.5% | 0.089 |
| 5-4 Inventive | 0.380 | 0.397 | 86.8% | 0.084 |
| 5-4 Inventive | 0.361 | 0.361 | 79.3% | 0.082 |
| 5-4 Inventive | 0.355 | 0.348 | 85.2% | 0.078 |

[1]Percent luminance remaining after 239 hours

It can be seen from Table 5b that the inventive devices give good color, stability, and luminance. The color of light emitted by the devices is suitable, after appropriate filtration, for a white light-emitting device. It is possible to fabricate the device using the same host material for the two light-emitting layers.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

| PARTS LIST |
|---|
| 101 Substrate |
| 103 Anode |
| 105 Hole-Injecting layer (HIL) |
| 107 Hole-Transporting Layer (HTL) |
| 109 Light-Emitting layer (LEL) |
| 111 Electron-Transporting layer (ETL) |
| 113 Cathode |
| 150 Power Source |
| 160 Conductor |

The invention claimed is:

1. An OLED device comprising a light-emitting layer containing a hydrocarbon host material and a light-emitting material of Formula (1):

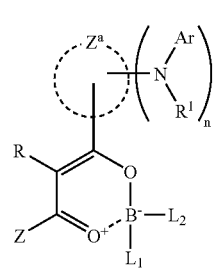

(1)

wherein:
 each Ar represents an independently selected aromatic group;
 each $R^1$ represents an independently selected alkyl group or aromatic group;
 n is 1 or 2;
 $Z^a$ represents the atoms necessary to form an aromatic ring group;
 R represents hydrogen or a substituent group;
 Z represents hydrogen or a substituent group; and
 $L^1$ and $L^2$ represent independently selected substituent groups; provided that any two adjacent substituents of any of the above groups may join to form a ring.

2. The device of claim 1 wherein an $R^1$ represents an aromatic group.

3. The device of claim 1 wherein n is 1.

4. The device of claim 1 wherein the light-emitting material is represented by Formula (2):

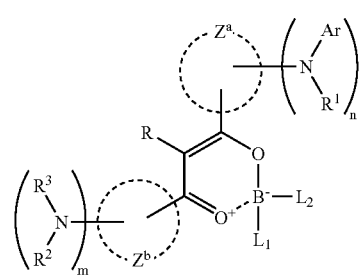

(2)

wherein:
 each Ar represents an independently selected aromatic group;
 each $R^1$, $R^2$, and $R^3$, represents an independently selected alkyl group or aromatic group;
 n is 1 or 2;
 m is 0, 1, or 2;
 $Z^a$ and $Z^b$ represent the atoms necessary to form independently selected aromatic ring groups;
 R represents hydrogen or a substituent group; and
 $L^1$ and $L^2$ represent independently selected substituents; provided that any two adjacent substituents of any of the above groups may join to form a ring.

5. The device of claim 4 wherein $R^1$, $R^2$, and $R^3$ represent independently selected aryl groups.

6. The device of claim 4 wherein n is 1 and m is 0 or 1.

7. The device of claim 4 wherein R represents hydrogen.

8. The device of claim 4 wherein $Z^a$ and $Z^b$ represent the atoms necessary to form independently selected benzene ring groups.

9. The device of claim 4 wherein $L^1$ and $L^2$ represent fluoro substituents.

10. The device of claim 1 wherein the light-emitting material is represented by Formula (3),

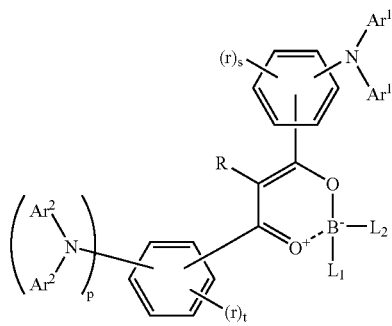
(3)

wherein:
each $Ar^1$ and each $Ar^2$ represents an independently selected aromatic group;
R represents hydrogen or a substituent group;
p is 0 or 1;
each r represents a substituent group;
s is 0-4;
t is 0-5;
$L^1$ and $L^2$ represent independently selected substituents; provided that any two adjacent substituents of any of the above groups may join to form a ring.

11. The device of claim 10 wherein s and t are 0, and $L^1$ and $L^2$ represent fluoro.

12. The device of claim 1 wherein the material of Formula (1) is present at a level of 0.1 to 15% by volume of the layer.

13. The device of claim 1 wherein the material of Formula (1) is present at a level 0.5 to 5% by volume of the layer.

14. The device of claim 1 wherein the hydrocarbon host comprises an aromatic fused ring group.

15. The device of claim 1 wherein the hydrocarbon host is represented by Formula (4),

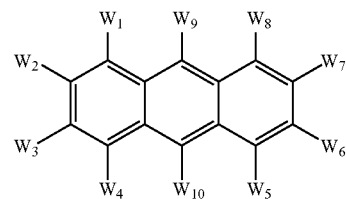
(4)

wherein:
$W_1$-$W_{10}$ independently represent hydrogen or an independently selected substituent, provided that two substituents may join to form a ring.

16. The device of claim 15 wherein $W^9$ and $W^{10}$ represent an independently selected naphthyl group, biphenyl group or anthracenyl group and $W^1$-$W^8$ represent hydrogen.

17. The device of claim 1 wherein the hydrocarbon host comprises at least 40% of the layer by volume.

18. The device of claim 1 wherein a second light-emitting layer is present comprising a host material and a light-emitting material.

19. The device of claim 18 wherein the host material in the second light-emitting layer is a hydrocarbon.

20. The device of claim 1 wherein white light is produced either directly or by using filters.

* * * * *